(12) United States Patent
Ortner et al.

(10) Patent No.: US 9,165,889 B2
(45) Date of Patent: Oct. 20, 2015

(54) ALIGNMENT MARK DEFINER

(71) Applicant: Infineon Technologies AG, Neubiberg (DE)

(72) Inventors: Joerg Ortner, Drobollach (AT); Josef Campidell, Villach (AT); Andreas Greiner, Grosserkmannsdorf (DE)

(73) Assignee: Infineon Technologies AG, Neubiberg (DE)

( * ) Notice: Subject to any disclaimer, the term of this patent is extended or adjusted under 35 U.S.C. 154(b) by 188 days.

(21) Appl. No.: 13/931,396

(22) Filed: Jun. 28, 2013

(65) Prior Publication Data

US 2015/0000149 A1    Jan. 1, 2015

(51) Int. Cl.
    *H01L 23/544*    (2006.01)

(52) U.S. Cl.
    CPC ....... *H01L 23/544* (2013.01); *H01L 2223/5442* (2013.01); *H01L 2223/54406* (2013.01); *H01L 2223/54426* (2013.01); *H01L 2223/54453* (2013.01)

(58) Field of Classification Search
    CPC ............................................ H01L 2223/54426

USPC ...................... 33/533, 645; 257/797; 438/401
See application file for complete search history.

(56) References Cited

U.S. PATENT DOCUMENTS

| | | | | |
|---|---|---|---|---|
| 4,342,090 A | * | 7/1982 | Caccoma et al. | 716/118 |
| 5,733,690 A | * | 3/1998 | Jeong et al. | 430/5 |
| 5,777,392 A | * | 7/1998 | Fujii | 257/797 |
| 5,853,255 A | * | 12/1998 | Soshi et al. | 400/237 |
| 6,809,002 B2 | * | 10/2004 | Yabe et al. | 438/401 |
| 7,238,592 B2 | * | 7/2007 | Doumae | 438/462 |
| 7,425,396 B2 | * | 9/2008 | Gruss et al. | 430/22 |
| 8,569,899 B2 | * | 10/2013 | Zhang et al. | 257/797 |
| 8,778,779 B2 | * | 7/2014 | Naoe | 438/462 |
| 8,841,784 B2 | * | 9/2014 | Ishida | 257/797 |
| 8,930,011 B2 | * | 1/2015 | Heo et al. | 700/121 |
| 2012/0049186 A1 | * | 3/2012 | Li et al. | 257/48 |

\* cited by examiner

*Primary Examiner* — Christopher Fulton
(74) *Attorney, Agent, or Firm* — Slater & Matsil, L.L.P.

(57) ABSTRACT

An alignment mark definer is configured to provide a geometrical definition for an actual alignment structure to be formed at a temporary surface of a substrate based on a desired appearance of the alignment mark and on an expected alteration of an appearance of the actual alignment structure caused by a deposition material deposited on the temporary surface and the actual alignment structure.

23 Claims, 26 Drawing Sheets

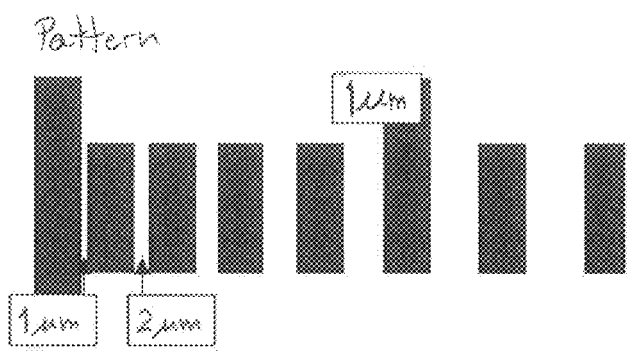
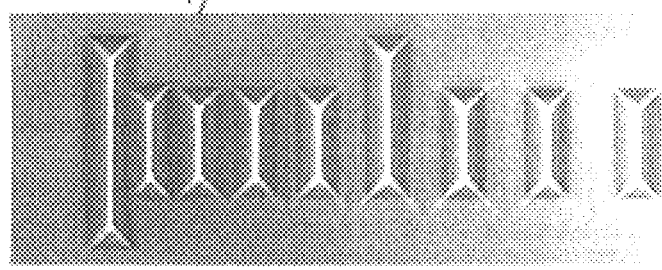
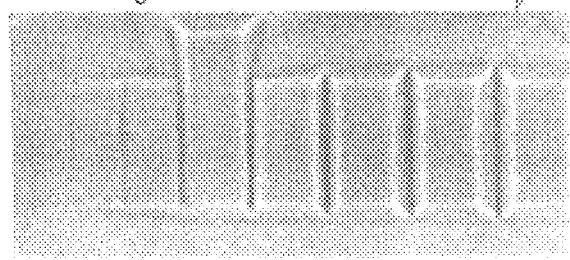
Fig 1

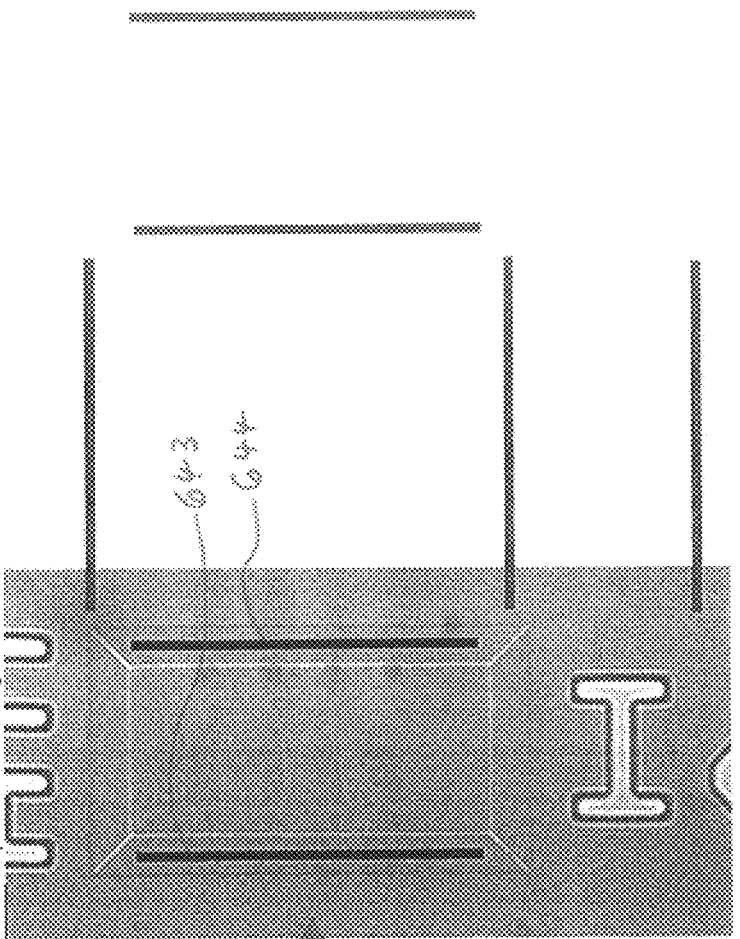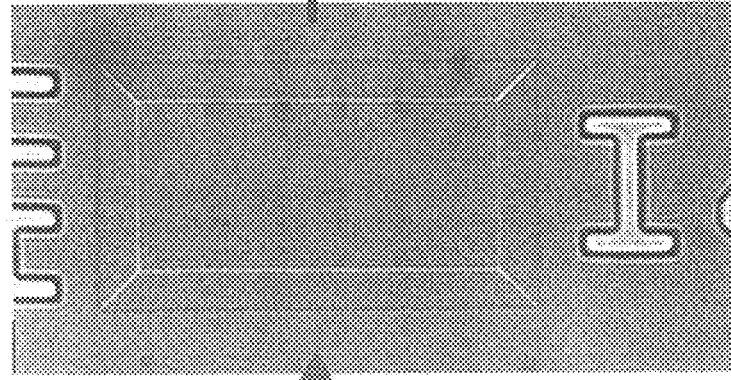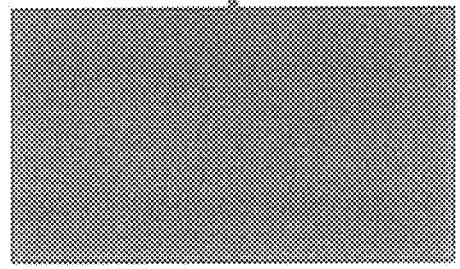

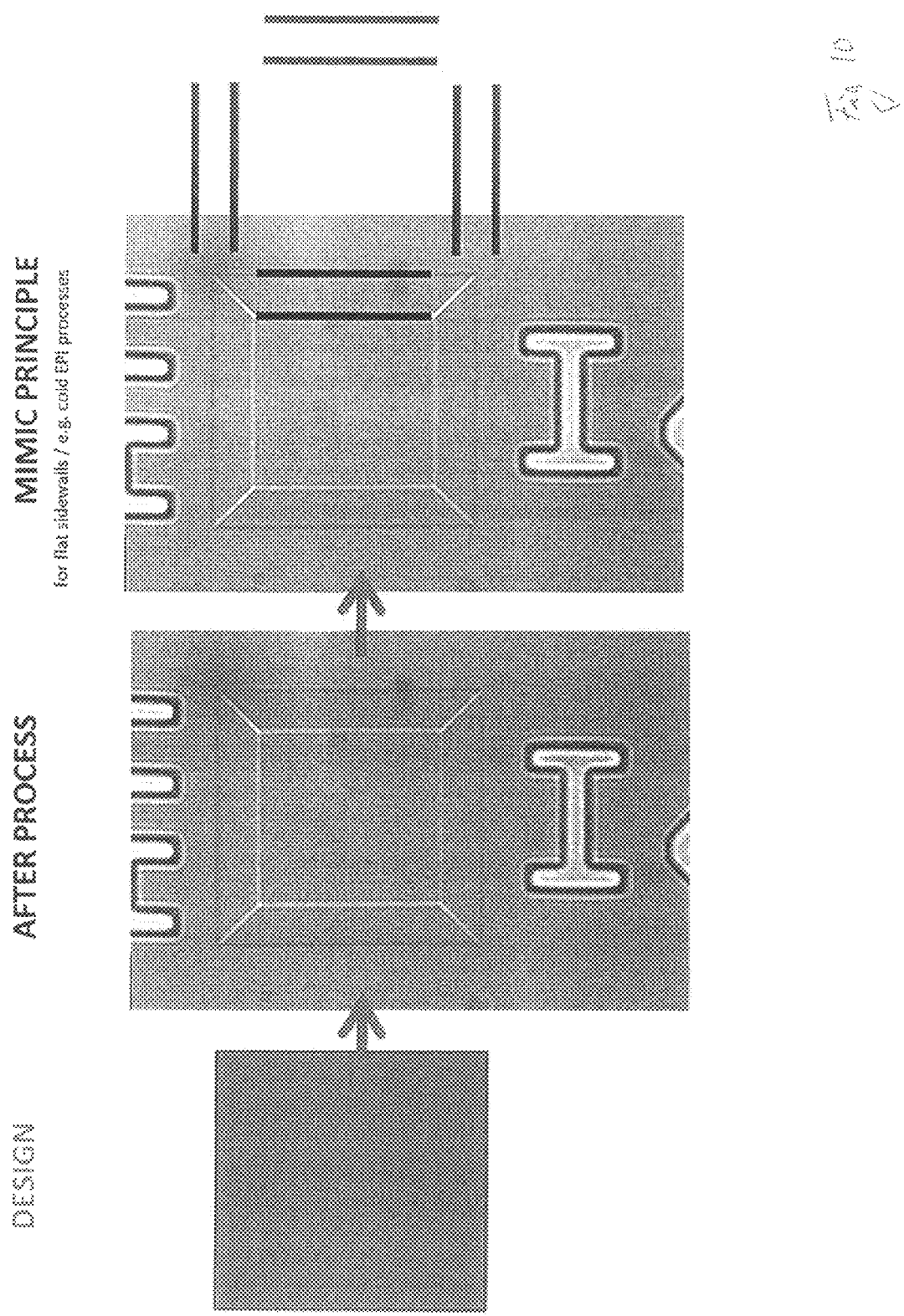

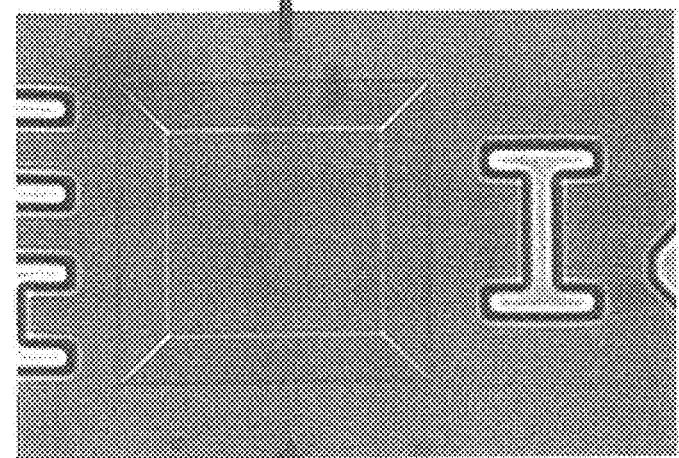
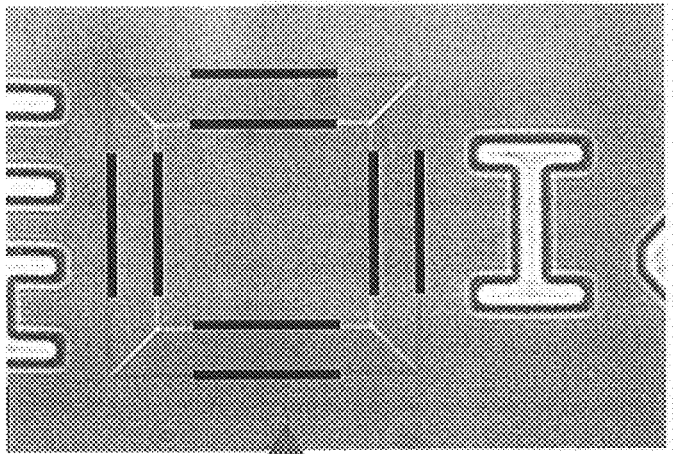
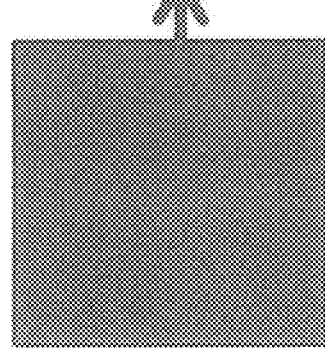

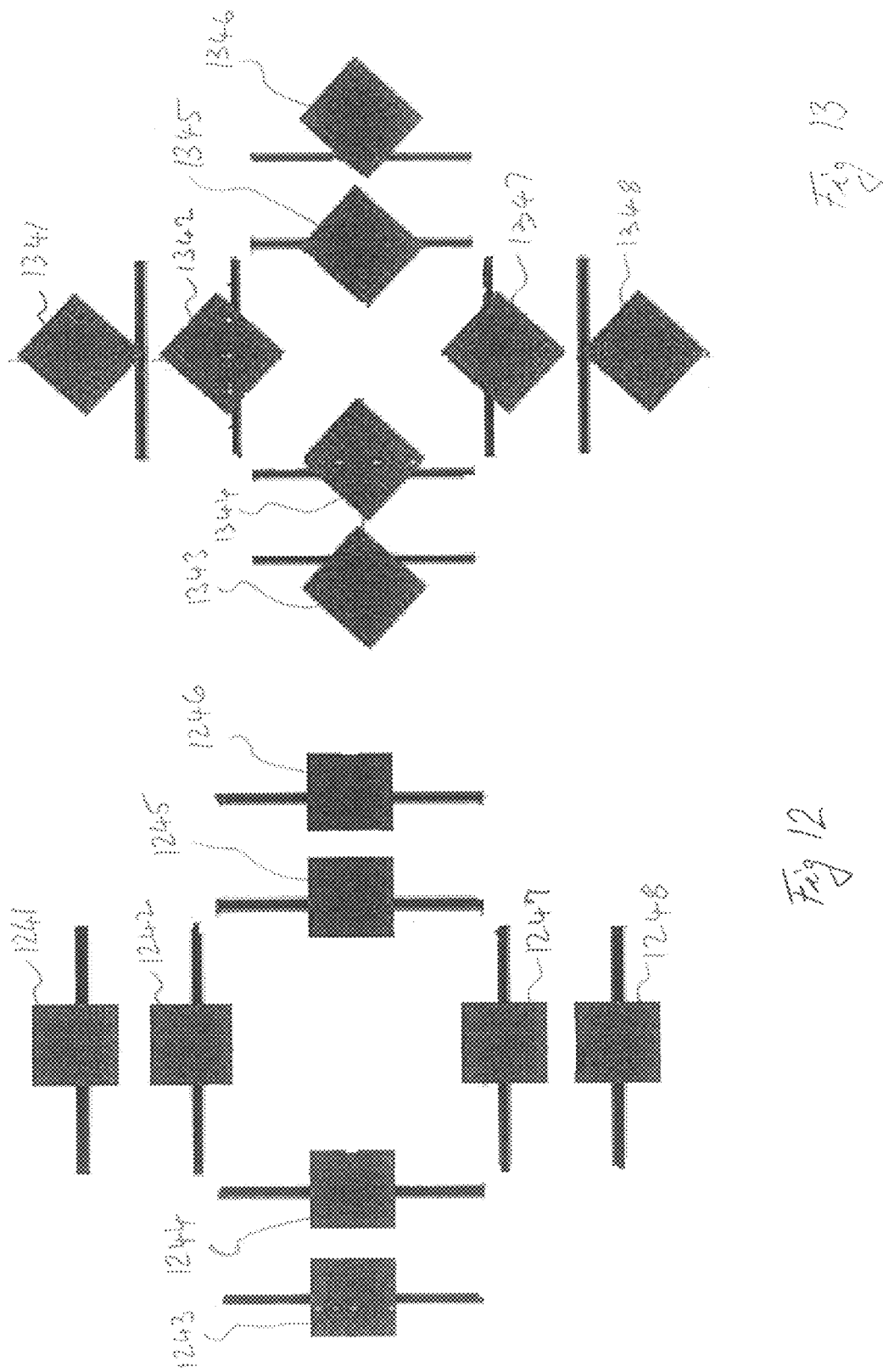

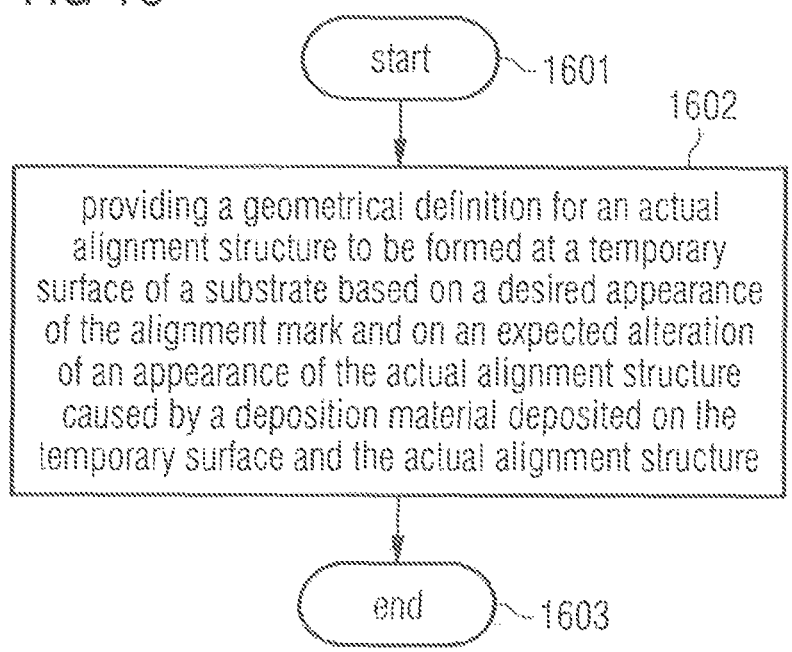

ALIGNMENT MARK DEFINER

TECHNICAL FIELD

Embodiments relate to an alignment mark definer. Some embodiments relate to an alignment mark detector. Some embodiments relate to a method for defining an alignment mark. Some embodiments relate to a non-transitory storage medium having stored thereon a computer program for performing the method for defining an alignment mark. Some embodiments relate to a method for defining the geometry of an alignment mark. Some embodiments relate to the interaction of design of the alignment mark with the subsequent (deposition) process. Some embodiments relate to performing an alignment through epitactic silicon by mimicking alignment marks, e.g., XY alignment marks as defined by certain manufacturers of steppers used in semiconductor fabrication.

BACKGROUND

The fabrication of semiconductor devices typically comprises a sequence of photolithography steps. During each photolithography step, the structure of a specific layer of the semiconductor device is transferred onto the (temporary) surface of the semiconductor device, for example, by exposing selected areas of a photo resist to ultraviolet light. The selective exposure of the photoresist can be done using a photo mask or by scanning the photo resist with an ultraviolet laser. The semiconductor device thus prepared then undergoes further processing steps, such as etching, ion implantation, or deposition of a material on the temporary surface of the semi-finished semiconductor device. In order to make useful devices the patterns for different lithography steps that belong to a single structure must be aligned to one another. To this end, a particular pattern may include a set of alignment marks. The alignment marks may be regarded as high precision features that are used as a reference when positioning subsequent patterns to the preceding pattern. This makes it possible to position a subsequent photo mask sufficiently precisely with respect to a preceding photo mask and to the structure that has been created in the meantime using the preceding photo mask.

Some semiconductor devices comprise one or more specially tuned layers of epitactically grown semiconductor material (EPI). The epitactically grown material is typically silicon, but may be another material, as well. Among others, power semiconductor devices or power integrated circuits (power ICs) which may be used as, e.g., a switch or rectifier in power electronics, are one example of using epitactically grown silicon. These power semiconductor devices or power ICs may be built using a vertical structure. One option for providing such a vertical structure of the semiconductor device is to use an epitaxy step during the fabrication of the semiconductor device.

SUMMARY OF THE INVENTION

An alignment mark definer is provided that is configured to provide a geometrical definition for an actual alignment structure to be formed at a temporary surface of a substrate based on a desired appearance of the alignment mark and on an expected alteration of an appearance of the actual alignment structure caused by a deposition material deposited on the temporary surface and the actual alignment structure.

An alignment mark detector is provided that is configured to transform a geometrical definition for an actual alignment structure to be formed at a temporary surface of a substrate to a transformed appearance as it appears when observing the actual alignment structure through a layer of deposition material that is deposited on the temporary surface and on the actual alignment structure.

A method for defining an alignment mark is provided. The method comprises providing a geometrical definition for an actual alignment structure to be formed at a temporary surface of a substrate based on a desired appearance of the alignment mark and on an expected alteration of an appearance of the actual alignment structure. The alteration is (mainly) caused by a deposition material deposited on the temporary surface and on the actual alignment structure.

BRIEF DESCRIPTION OF THE DRAWINGS

Embodiments of the present invention are described herein making reference to the appended drawings.

FIG. 1 schematically illustrate the effect of EPI on etch structures for two different EPI processes;

FIG. 9 schematically illustrates a detail of a mimicking example of an XY-Mark;

FIG. 10 schematically illustrates an example that uses one side wall of a square/rectangle to mimic one bar of the alignment mark;

FIG. 11 schematically illustrates an example that mimics the entire XY alignment mark using one square;

FIG. 12 shows a further example of a geometrical definition for an actual alignment structure comprising one bar of the desired appearance of the alignment mark;

FIG. 13 shows an example using one diamond shaped to mimic one part of the desired appearance of the alignment mark;

FIG. 16 shows a schematic flow diagram of a method for defining an alignment mark;

Figure 2:
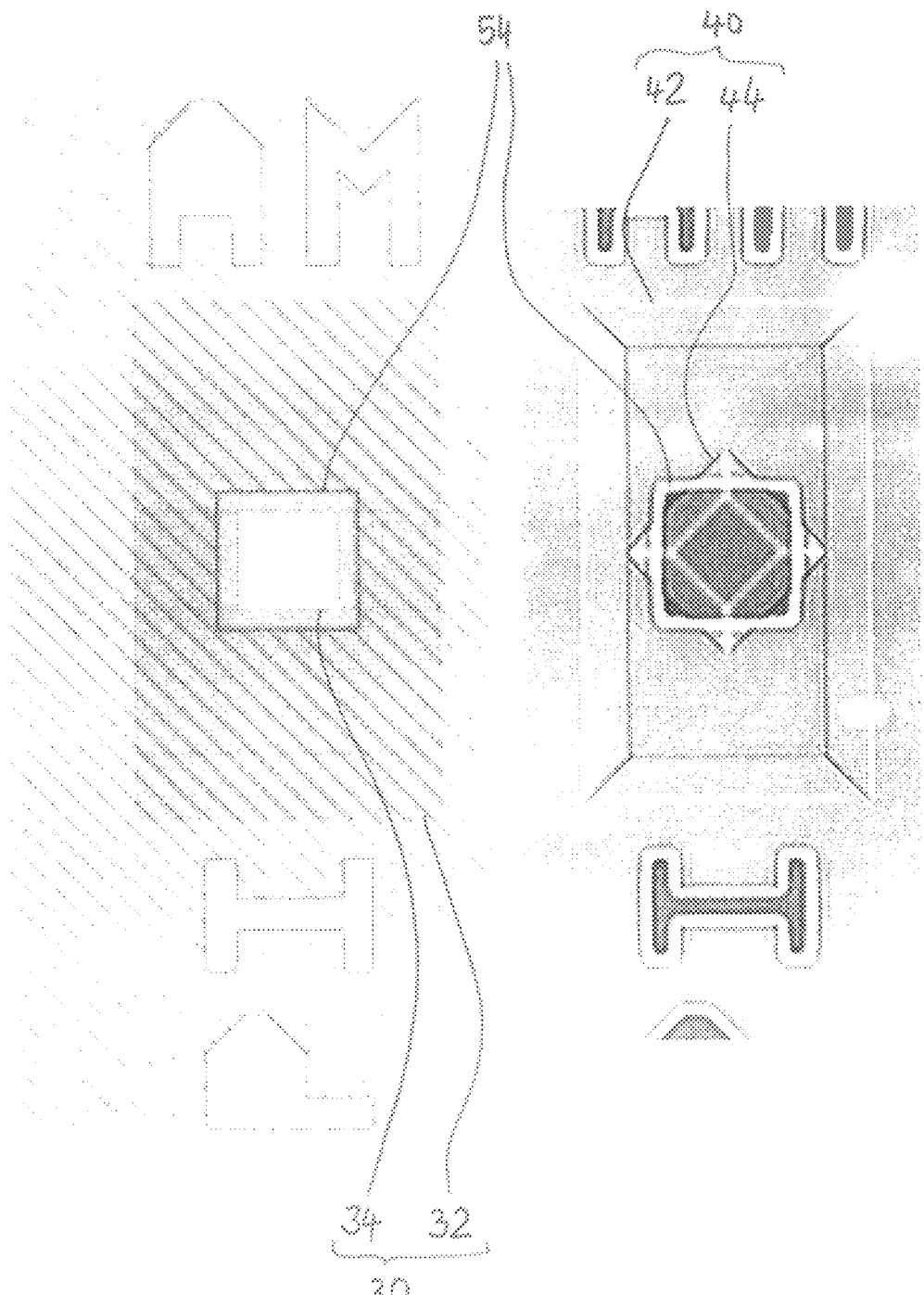
FIG. 2 schematically illustrates a geometrical definition of an alignment mark at a first mask layer (left) and an outcome after an EPI process (right)

Equal or equivalent elements or elements with equal or equivalent functionality are denoted in the following description by equal or equivalent reference numerals.

DETAILED DESCRIPTION OF ILLUSTRATIVE EMBODIMENTS

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Taking the class of power semiconductor devices and power ICs as an example, there is an ongoing desire to improve these devices/ICs with respect to performance, price, production cost, etc. These improvements may result in changes in the production processes. To improve electrical performance, EPI layers get thicker or get implemented on further technology platforms which so far did not make use of EPI processes between lithography layers. Furthermore, aggressive shrink roadmaps and the corresponding design rules may require reduction of overlay specifications for the alignment of lithography layers relative to each other, i.e., the alignment needs to become more precise. The term "technology" might as well be described as "process integration scheme" or, in specific cases, as "variation of deposition process."

Alignment marks typically deteriorate as they get covered by EPI, so that a new concept for alignment would be desirable.

FIG. 1 shows how a pattern with a variation of lines and spaces reacts on subsequent EPI deposition. Two different EPI processes are shown as examples. The upper part in FIG. 1 schematically illustrates the pattern that is formed at a temporary surface of the semi-finished semiconductor device, for example, by means of etching. Depending on whether this pattern is used to expose a positive photomask or a negative photomask, the dark area will result in so-called "windows" or "islands." The windows are recesses formed at the temporary surface and the islands are elevations protruding from the temporary surface. These island or elevations may be formed by removing (e.g., etching away) the material that surrounds the island. Other options for forming windows and/or islands may also be employed. To give you some numbers as an example, the height or depth of the islands/ windows represented by the dark parts of the pattern may be 1 μm. The leftmost space may have a width of 1 μm, as well. When progressing to the right of the pattern, the spaces get wider and wider (for example, the second space from the left has a width of 2 μm, as indicated in FIG. 1).

The center portion of FIG. 1 shows the appearance of the pattern after it has been altered by the deposition of an EPI layer according to a first EPI process. When we assume that the dark portions of the pattern corresponds to substantially brick-shaped islands, the altered appearance of these pattern portions look like prisms or "roofs" from above. In the contrary case, when the dark portions of the pattern define substantially brick-shaped windows (i.e., trenches) the altered appearance at a surface of the deposition material deposited by the EPI process makes them look like "troughs." In other words, vertical side walls of the islands or of the windows of the original pattern are changed to diagonal ramps in the altered appearance.

The bottom portion in FIG. 1 shows the altered appearance of the pattern after a different EPI process has been performed (example 2). It can be seen, that the substantially brick-shaped structures of the pattern have been transformed into structures that look like elongated frustums of pyramids (or upside down pyramids in case the dark pattern portions define windows). It can also be seen that the size of the structures has increased so that neighboring structures of the original pattern as shown in the top part of FIG. 1 are almost merged or already merged, depending on the width of the lines or gaps between two structures. For comparison it may be noted that the altered appearance after EPI process example 1 in the center of FIG. 1 shows only a very modest modification of the size of the structures. Only the left most structure and the second structures have merged so that the 1 μm line (gap) defined by the original pattern is not visible anymore.

During the fabrication of semiconductor devices, the following exemplary sequence of processes may be used:

| | |
|---|---|
| resist coat | |
| lithography "n" | (prints devices and alignment marks) |
| develop | (dissolve exposed areas of resist) |
| implant (optional) | (device area) |
| etch (optional) | (mainly needed for structuring of alignment targets/ alignment marks) |
| strip resist | |
| EPI growth (opt.) | (needed for device definition, but deteriorating the targets in the scribeline) |
| resist coat | |
| lithography "n + 1" | (needs to be aligned to previous layer defined by litho "n") |

Not all of the steps "implant," "etch," and "EPI growth" marked as "optional" are necessarily performed during every iteration n. The above sequence of processes typically only describes a small portion of a typical fabrication of semiconductor devices. In particular, the steps between "resistor coat" and "EPI growth" are typically repeated for n=1 . . . N, wherein N is the total number of lithography steps.

Current concepts hit their limits regarding applicable designs of EPI alignment targets for thick epitactical layers. Further limitations need to be considered, as a wide variety of base materials (silicon with different crystal orientation or SiC, i.e., silicon carbon) is used.

Some of the limitations that may have to be considered are listed now. Assume a semiconductor process that is exposed using ultraviolet light of wavelength 365 nm. Exposure is typically done with so-called i-line steppers (wavelength of light: 365 nm). Before the existence of the i-line steppers, so-called g-line steppers where used (wavelength of light used for exposure: 436 nm). The terms "i-line" and "g-line" refer to the corresponding spectral lines of the mercury spectrum. For alignment, so-called "HeNe-marks" may be used (alignment targets scanned with a helium neon laser) with a design pitch of 20 μm and four bars+two "fences." The applicability of these designs and variations thereof to processes using thick EPI are limited. In particular, these alignment marks may suffer from significant degradation caused by an epitaxy process, i.e., the alignment mark may not be detectable anymore by an alignment mark detector when the alignment mark is covered by an EPI layer having a certain thickness.

Currently HeNe marks having four bars+two fences are sometimes used or variations thereof (bar width standard=4 μm; for EPI alignment typically wider bars are designed, as after deposition the bar width may decrease).

The maximum EPI thickness that still delivers alignable structures on the wafers depends on various process parameters, like:
- deposition rate [μm/min]
- chemistry (e.g., DCM/TCM, i.e., dichloromethane/trichloromethane)
- base material and crystal orientation
- etch depth of markers
- deposition temperature
- design of alignment marks
- etc.

For example, for a typical semiconductor fabrication process for obtaining power semiconductor devices and/or power ICs (1,135° C. EPI temperature, 500 nm etch depth for alignment targets, deposition rate 3 μm/min), the maximum EPI thickness is about 16.5 μm. Beyond this thickness, the detection of the alignment marks gets too unreliable. Badly aligned mask layers may result in erroneously manufactured semiconductor devices that might not meet the specifications or that might not even function at all.

As new semiconductor device designs need higher overall EPI thickness, the alignment markers need to get "refreshed" meaning an additional lithography for alignment markers and a subsequent etch needs to be done before this maximum thickness gets exceeded. These extra processes for refreshing alignment markers are significant cost adders. Moreover, by generating new markers, the subsequent lithography layers are only aligned indirectly to the underlying layers. This has a negative influence on shrink concepts.

Figure 3:
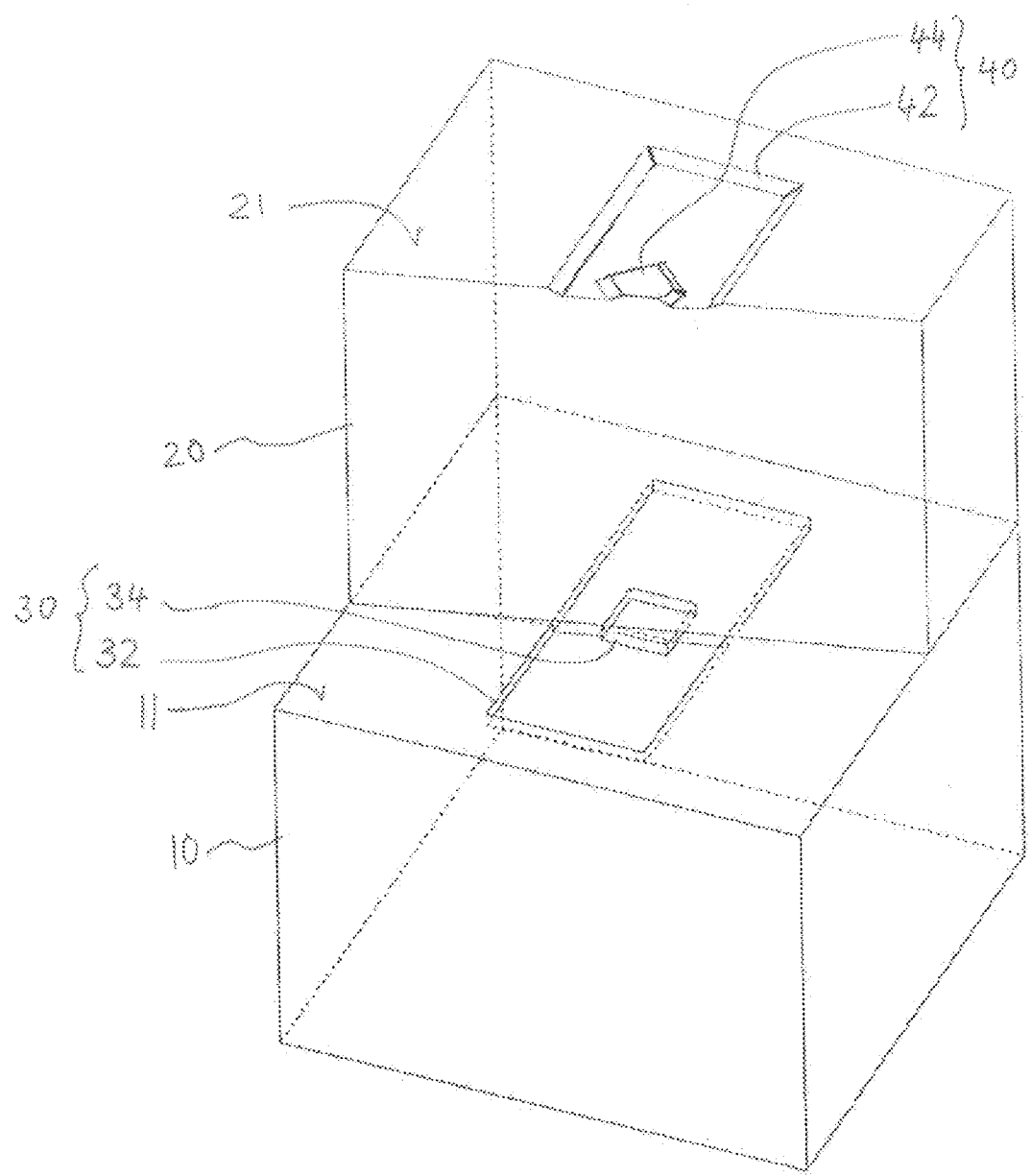
FIG. 3 shows a schematic perspective cutaway view of a temporary surface of a semiconductor device with an actual alignment structure and an EPI layer deposited on the temporary surface and on the actual alignment structure, to illustrate the alteration of the actual alignment structure.

FIG. 2 illustrates an alteration of the appearance of an alignment mark that is caused by an EPI layer deposited on top of the alignment mark. FIG. 3 illustrates substantially the same alteration as a schematic, perspective cutaway view. In FIG. 3 it can be seen that an actual structure 30 is formed in a temporary surface 11 of a semi-finished semiconductor device 10. The actual structure 30 comprises an elongate, shallow window 32 (i.e., a recess) and an island 34 disposed within the elongate shallow window 32. The island 34 has a flat, square shape. After the actual structure 30 has been formed in the temporary surface 11, an EPI layer 20 is deposited or grown on the temporary surface 11 and also on the actual structure 30. In most cases, the EPI process used for depositing the EPI layer 20 is not able to maintain the geometry of the actual structure 30. Accordingly, an altered appearance 40 of the actual structure 30 is created at a new surface 21 after the EPI process is finished. The altered appearance 40 comprises an elongate, shallow window 42, the sidewalls of which are sloped, as opposed to the vertical sidewalls of the window 32 of the actual structure 30. The island 34 has undergone an even stronger alteration in that the original square shape appears to be rotated by 45°. This apparent rotation is not a true rotation, but rather caused by the way the EPI material grows at the corners of the island 34. Among others, the growth behavior of the EPI layer is influenced by the crystal orientation of the substrate.

FIG. 2 shows the actual structure 30 in the left part of FIG. 2 and the altered appearance 40 in the right part. The square 54 is an alignment control box that is formed in the subsequent photo mask.

The influence of the EPI layer 20 on the alteration of the actual structure 30 shown in FIGS. 2 and 3 is valid for a first EPI process ("PROCESS A"). The behavior of this EPI process can be described as follows: the epitaxial growth forms new edges at 45° angle at "outer corners" (see island 34 and its altered appearance 44), whereas inner corners stay stable at 90° (see the window 32 and its altered appearance 42). FIG. 2 shows in the left part the layout of a structure, where the hatch pattern and the letters "AM" and "PI" are related to the subsequent layer that shall get aligned to the EPI-covered layer AM. These letters are provided as a means for identification. On the right-hand side in FIG. 2 a microscope picture shows how the EPI process apparently "twists" the inner box of the AM layer ("island structure"). The corners of the window 32 do not get rotated, however, the edges grow towards the inner structure. The abbreviation "AM" means "alignment markers."

A different EPI process ("PROCESS B") shows an inverse behavior to the previously described "PROCESS A," mainly due to the fact that different base material is used. A design rule for "PROCESS B" is to avoid "inner corners" as they will get rounded; outer corners will stay stable but grow outwards.

Figure 4:
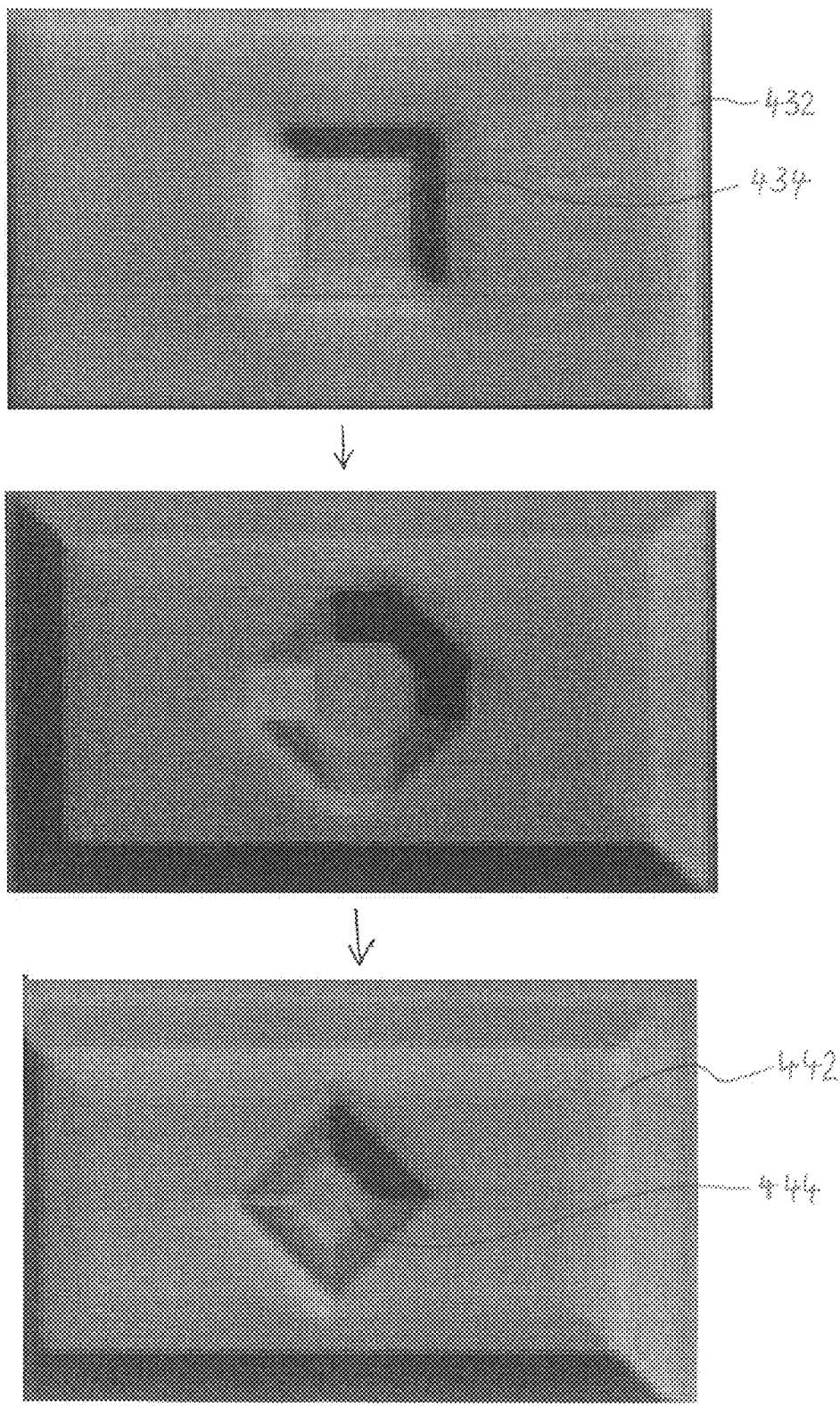
FIG. 4 shows an actual alignment structure, an intermediate appearance of the actual alignment structure that can be observed during the epitaxy process, and a final alteration of the actual alignment structure after the EPI process is finished.

FIG. 4 illustrates the successive transformation of an actual structure at the temporary layer 11 to the altered appearance at the new surface 21. In this example, the actual structure comprises an elongate island 432 and a square window 434 that is formed at a center of the elongate island 432. The upper image in FIG. 4 shows the actual structure as it is formed at the temporary surface 11. The center image in FIG. 4 shows a slightly altered appearance of the actual structure after an EPI layer of a moderate thickness has been deposited on the temporary surface 11. Since the EPI material grows at a 45° at the corners of the window 434, the window 434 appears to have an octagonal shape. The lower picture in FIG. 4 shows the altered appearance of the actual structure after the EPI process has been finished. The island 442 has sidewalls that are sloped instead of vertical as in the actual structure 432. The window 444 has a diamond shaped due to the 45° growth behavior of the deposition material.

When the actual structure that is formed at the temporary surface 11 is an alignment mark, the alteration of its appearance caused by the EPI process may become too strong for a reliable detection of the alignment mark by an alignment mark detector. In particular, the alignment mark detector may not be capable anymore of identifying the altered appearance as the alignment mark that the detector is looking for.

Figure 5:
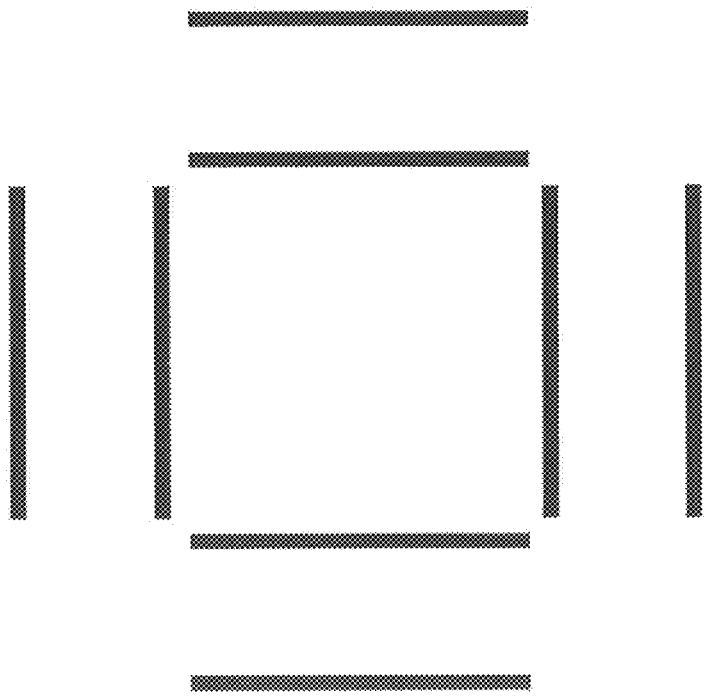
FIG. 5 schematically illustrates a standard geometrical definition for an alignment structure.

FIG. 5 schematically illustrates a particular design for an alignment mark. Similar alternative alignment marks may have a narrower gap between parallel bars that form one side of the square structure. Further alternative alignment marks may have four parallel bars to form each side of the square structure. The line width is, for example, 0.6 μm. A new concept is suggested that allows for alignment through challenging EPI layers as those standard designs will undergo severe deterioration upon EPI deposition and get useless, as described below. In order to deal with these challenging EPI layers, new designs of alignment marks are provided, along with special settings in the stepper-job menu, which allows the stepper to focus on the identification of the altered appearances, rather than the actual geometry of the alignment marks.

The inventors have observed that standard designs are not suited for alignment through relatively thick EPI layers. The standard designs have line width of 0.6 μm and a pitch of (maximum) 10 μm. Those marks would not survive EPI-processes, as the 0.6 μm "trench" would get filled up upon EPI deposition for window designs; when using an island design, the pitch of 10 μm would not be sufficient from preventing the lines from growing together.

Among others, the proposed alignment mark definer is based on a "mimicking concept" which is a combination of the use of new standard alignment mark-like designs that differ from the standard designs and yield stable structures even if covered by (thick) EPI.

By reading out those nonstandard structures using, for example, the XY-mark option settings in the stepper job parameter list, the stepper (i.e., alignment mark detector) will be able to recognize those nonstandard structures and align to them. A list of editable parameters for the relevant alignment, settings at the exposure tool (a particular manufacturer's exposure tool is chosen in this example) are shown in the table 1 below. The default values are in brackets (e.g., mark length default is 23 μm).

TABLE 1

AGA

| Mark | Direction | set to "X and Y" Option |
|---|---|---|
| XY Option | AA Mark XY Option Mark Number | 4, 6, 8, 10, 12 (e.g., set to 4) |
| Mark center span | | Range 3-70 μm (26 μm): set to fit process results |
| Mark length | | Range 3-26 μm (23 μm): set to fit process results |
| Measure/mark pitch | Mark No 1-2 | Measure y/n Mark pitch range 2-30 μm (6): set to fit process results |
| | Mark No 2-3 | Measure y/n Mark pitch range 2-30 μm (6): set to fit process results |

AGA stands for "advanced global alignment," which can more generally get called "fine alignment" or "alignment." It may refer to a specific alignment sequence on an exposure tool.

AA: auto alignment; typically covers all "steps" and algorithms the exposure tool uses to automatically align to marks on the wafer.

Pitch: periodicity of multiple patterns; here a parameter of the stepper recipe.

Table 1 contains some of the setup parameters describing an XY-mark available on steppers of a particular manufacturer.

The above table defines set of parameters describing the XY-Mark available at steppers. In order to come up with feasible designs, one has to be aware of the characteristics of the EPI processes.

Figure 6:
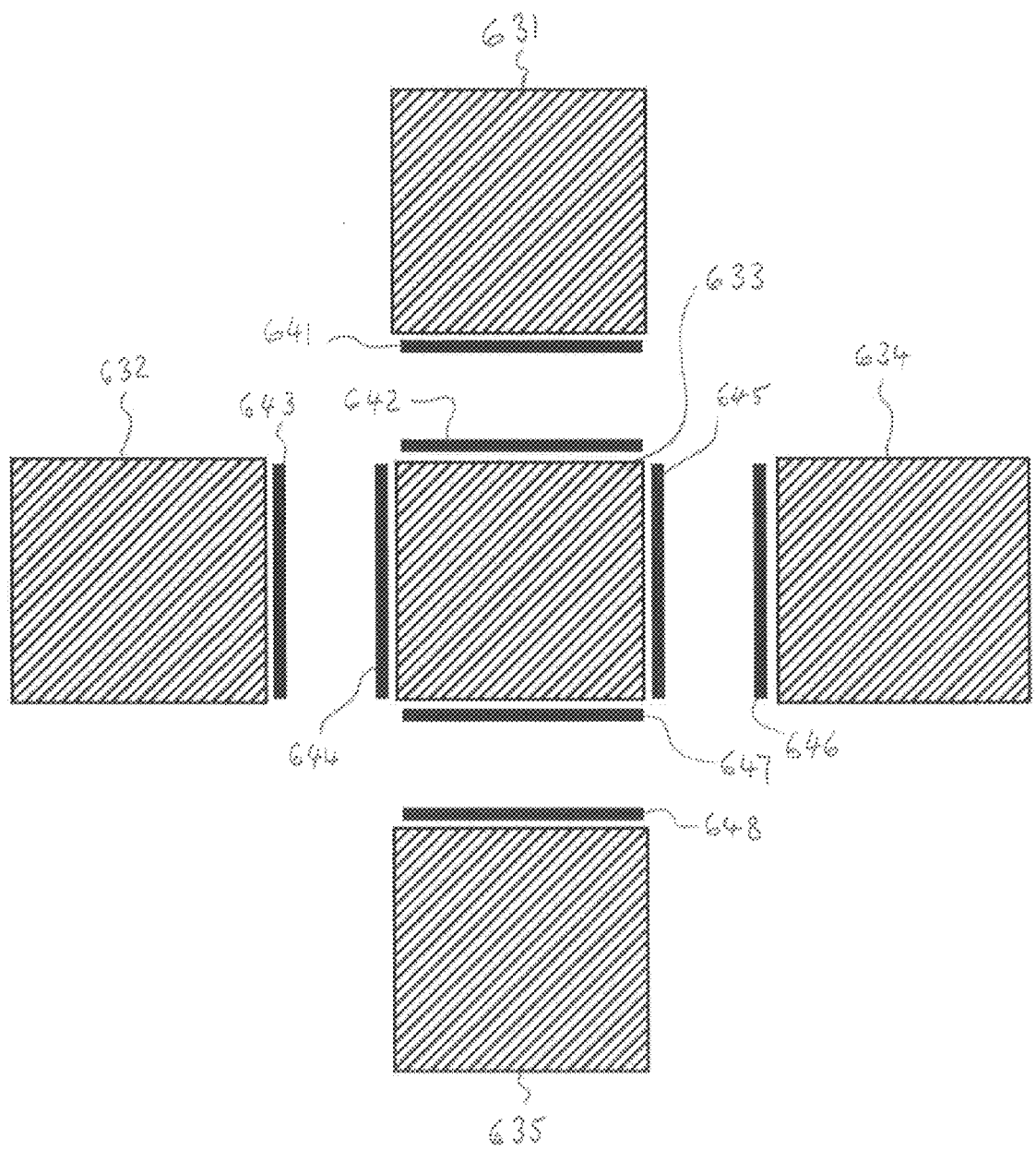
FIG. 6 schematically illustrates a first example of a geometrical definition for an actual alignment structure and the corresponding desired appearance of the alignment mark.
Figure 7:
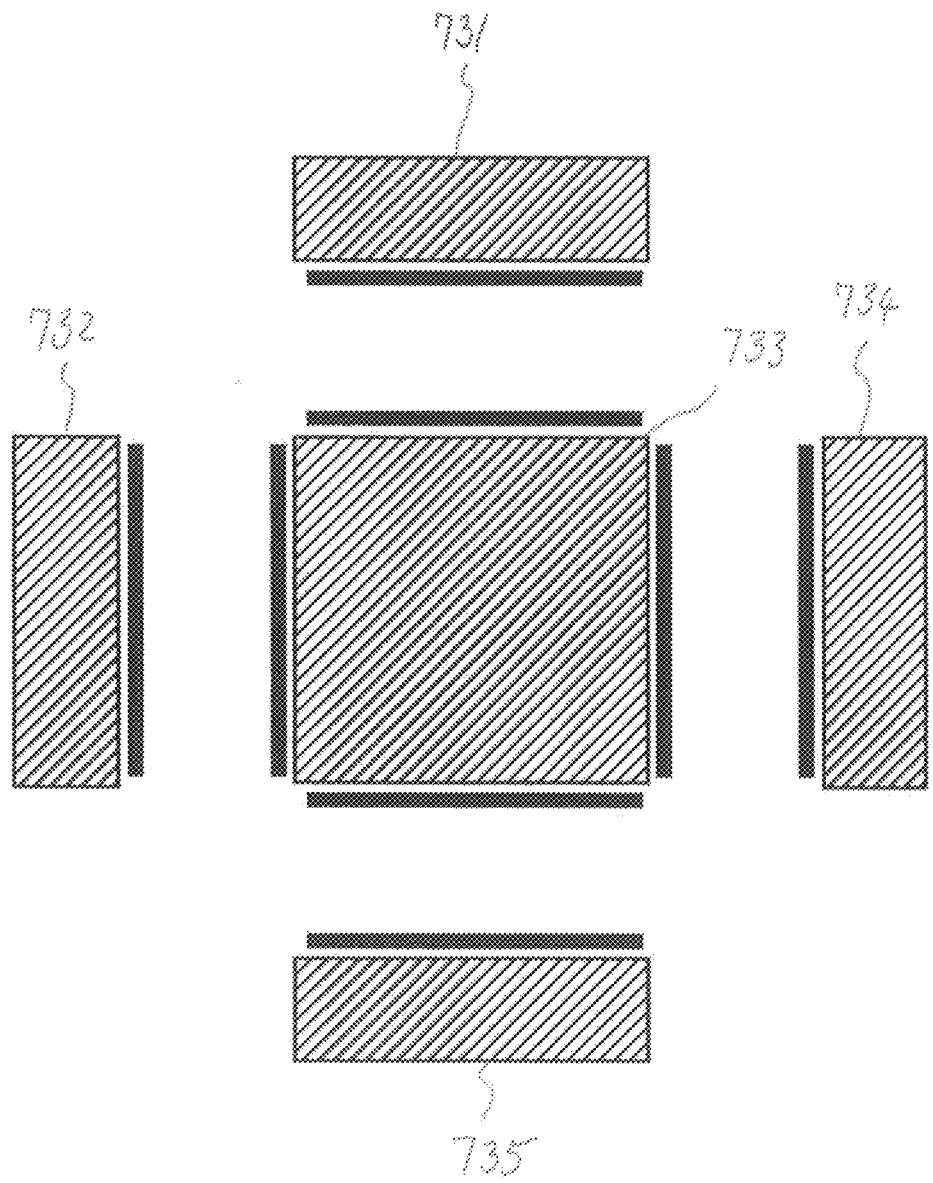
FIG. 7 schematically illustrates a second example of a geometrical definition for an actual alignment structure and the desired appearance of the alignment mark.
Figure 8:
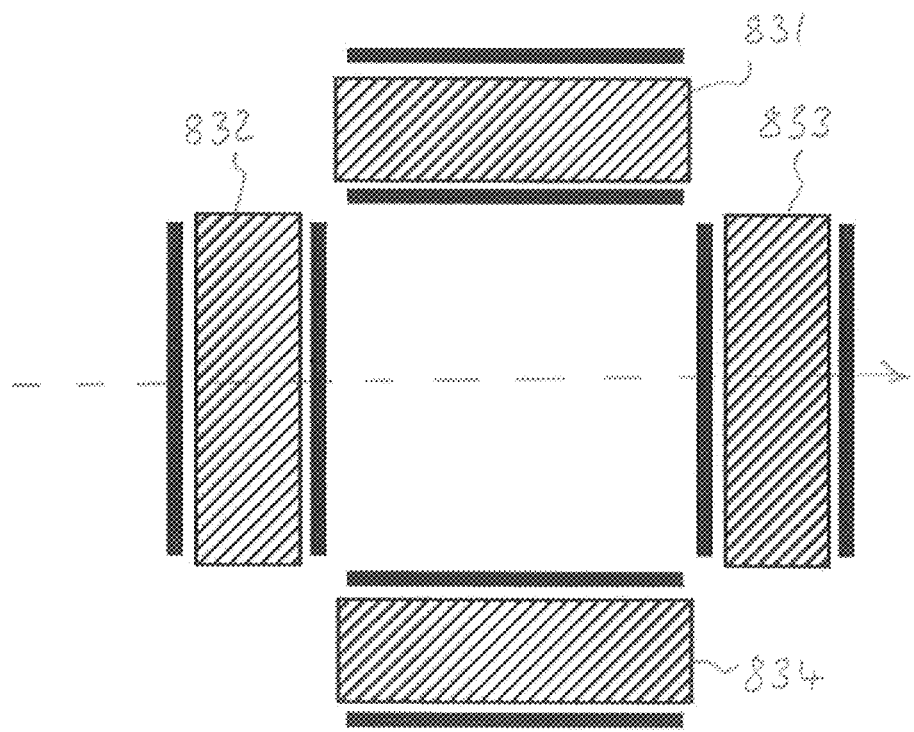
FIG. 8 schematically illustrates a third example of a geometrical definition for an actual alignment structure and for the desired appearance of the alignment mark.

Examples for simple mimic-type designs that can be deduced by suggesting the use of the edges or sidewalls of wider (i.e., more stable) structures (hatched) to mimic the lines of the original marks. FIGS. 6 to 8 illustrate "mimicking" XY-marks using design features that are tolerant to EPI processes. FIG. 9 shows a further example.

In FIGS. 6 to 8, the hatched areas define EPI islands for "PROCESS B"-like processes (window designs for CN layers). For "PROCESS A"-like processes, the hatched areas define EPI windows (island designs for CN layers). The abbreviation CN means "contrast negative" and refers to the contrast definition: drawn structures (i.e., hatched areas) are chrome free and expose a positive resist (creating a resist opening and a "down" area after etching).

In FIG. 6, the desired appearance of the alignment mark is defined by eight bars 641-648. This desired appearance is what a stepper or alignment mark detector will look for to identify and locate the alignment mark. The desired appearance of the alignment mark is mimicked by five squares 631-635 which form the actual alignment structure that is formed at the temporary surface 11 of the substrate 10. Note that the term "substrate" refers to the structure that is beneath the temporary surface, regardless of whether it already contains one or more layers that have undergone transformation (e.g., ion implantation, etching, deposition, etc.). The alteration of the EPI process that has to be expected typically leads to a deterioration of the actual alignment structure 631-635. Some of the edges of the squares that form the actual alignment structure are aligned with one of the bars of the desired appearance of the alignment structure. If the behavior of the EPI process regarding these edges is known with sufficient precision, it is possible to predict how a particular edge will be altered by the EPI process. For example, the edge of one of the squares 631-635 can be placed at some distance from the position of the bar that said edge is supposed to mimic. During the EPI process, the square 631 might grow or shrink which also modifies the apparent position of the edge. If the previous prediction was sufficiently correct, then the edge of the altered appearance of the actual alignment structure coincides with the bar of the desired appearance of the alignment mark.

FIG. 7 shows an actual alignment structure that is similar to the one shown in FIG. 6. The difference is that the outer structures 731, 732, 734, 735 of the actual alignment structure are narrow rectangles instead of squares. Of these outer structures 731, 732, 734, 735 only one of the edges is used for mimicking the desired appearance. Therefore, the structures 731, 732, 734, 735 can be made more narrow. Typically, they should not be made too narrow, though, in order to prevent that they get filled or smoothed out during the EPI process.

In FIG. 8, the actual alignment structures are four rectangles 831-834 that are placed between two parallel bars of the desired appearance.

The purpose of the proposed alignment mark definer is to provide a geometrical definition for the actual alignment structure (e.g., 631-635) that is to be formed at the temporary surface 11 of the substrate. The geometrical definition output by the alignment mark definer may then be used to prepare a photomask or to program a scanning laser so that the actual alignment structure may be formed by, e.g., etching in the temporary surface 11. The geometrical definition provided by the alignment mark definer may be combined with the geometrical definition for useful semiconductor structures that shall also be formed on the temporary surface 11. The provision of the geometrical definition is based on a desired appearance 641-648 of the alignment mark. The provision of the geometrical definition is further based on an expected alteration of an appearance of the actual alignment structure, the expected alteration being caused by a deposition material (EPI material).

For practical reasons it may be useful that the desired appearance of the alignment mark mimics a standard alignment mark, such as the above mentioned alignment mark having a square structure with two bars at each side of the square structure with 23 μm side length and a gap width between the two bars of approximately 10 μm. Other (standard) shapes and parameters are of course also possible. The reason is that available steppers or alignment mark detectors (and/or alignment algorithms or algorithms to evaluate the form of the alignment signal, etc.) do not need to be reconfigured, but may continue to identify and locate the standard alignment marks. In case the mimic-XY mark signal pattern is (still) deviating from the standard alignment mark the stepper is expecting, the recognition upon alignment can be improved by tuning the parameters summarized in Table 1.

It may be useful if the proposed alignment mark definer would be configured to perform a reverse estimation of the expected alteration of the appearance of the actual alignment structure. The reverse estimation takes the desired appearance and by considering the alteration caused by the EPI process, the geometrical definition of the actual alignment structure can be determined that will yield an altered appearance after EPI process, which is sufficiently similar to the desired appearance.

The actual alignment structure 631-635 that implements the geometrical definition has an actual appearance, when covered by the deposition material, that mimics the desired appearance 641-648.

FIG. 9 shows a detail of a mimicking example of an XY-mark. The mimicking example in FIG. 9 is similar to what is shown in FIG. 8. The design (geometrical definition of actual alignment structure) is shown in the left part of FIG. 9 and can be described as a rectangular window or island. After the EPI process (deposition process), the sidewalls of the rectangular window/island are not orthogonal to the surface anymore, but sloped. As the sloped sidewalls may deliver a signal that can be detected by a stepper/alignment mark detector, two of the bars 643, 644 of the desired appearance can be mimicked by the two longer sidewalls. Briefly, FIG. 9 can be described as the geometrical definition for the actual alignment structure mimicking the desired appearance by providing a sidewall in a region, where the desired appearance defines one of a window and an island. This is mimicking principle is well suited for steep sidewalls, e.g., hot EPI processes. Temperature at EPI deposition and the EPI thickness will determine the angle (top view: "width") of the sidewall. "Hotter" EPI typically deliver steeper sidewalls than processes at lower temperatures. Deposition at lower temperature helps to reduce slip lines. FIGS. 10 and 11 illustrate further possibilities for pattern creation.

In FIG. 10, one sidewall of a square/rectangle is used to mimic one part of the alignment mark. The EPI process was performed at a relatively low temperature which yields flat sidewalls. The mimic principle is that geometrical definition provides an edge of a sidewall in a region where the desired appearance defines one of a window and an island (e.g., one of the bars 641-648).

FIG. 11 shows another example in which an arrangement of several windows or islands in the desired appearance is mimicked by the geometrical definition by one of a broad window and a broad island. In FIG. 11, the entire XY-alignment mark is mimicked using one square of the actual alignment structure. Sidewalls of the broad window/island are disposed in accordance with said arrangement of the windows/islands of the desired appearance. In FIG. 11, the arrangement of several windows/islands of the desired appearance comprises all eight bars. The inner bars of the desired appearance are mimicked by the inner square of altered appearance, said inner square having been formed by the fact that the originally orthogonal sidewalls of the design are altered to sloped sidewalls. The outer bars of the desired appearance are formed by the outer square formed by the sloped sidewalls of the altered appearance.

Orthogonal sidewalls of the actual alignment structure tend to be modified to sloped sidewalls by the EPI deposition. Accordingly, the alteration caused by the EPI deposition can be described as a spatial low pass filter.

The actual alignment structure (and accordingly its geometrical definition, as well) can be described as a spatial frequency divided version of the desired appearance. The division factor can be two or four. Consider FIG. 8, where the desired appearance comprises four bars that are oriented vertically with respect to the representation of FIG. 8. Each bar may be regarded as a pulse, as it would be normally implemented as an island ("ridge") or a window ("trench"). When scanning along the dashed line in FIG. 8, at each bar or "pulse" of the desired appearance, a sidewall of the actual alignment structure is provided. The directions of two successively provided sidewalls alternate, i.e., at a first bar of the desired appearance a rising sidewall for the structure 832 of the actual alignment structure is provided and at the subsequent second bar of the desired appearance, a falling sidewall for the structure 832 is provided, or vice versa. In this manner, the number of four bars in the desired appearance has been divided by two to yield the two structures 832 and 833. The same observation can be done for the vertical direction in FIG. 8 and the structures 831 and 834.

In FIG. 11 the spatial frequency division factor is four or even eight, depending on how the spatial frequency division is defined. Spatial frequency division factor=4: For four parallel bars of the desired appearance, only one structure of the actual alignment structure is provided. This is possible, because the inflection points of the sidewalls (at the bottom and the top of the corresponding sidewall) can be detected as the bars of the desired appearance.

Turning now to FIGS. 12 to 15, many designs based on above principles can be created. Additional options will, e.g., include segmented sub-structures ("dotted" structures; multiple elements forming the edge, which will get recognized by the stepper as one single line); compare FIGS. 12 to 15.

FIG. 12 schematically shows an example where each bar of the desired appearance is mimicked by one square or "dot" 1241 to 1248. The exposure tool may interpret the squares effectively as the bars of the desired appearance, because they are arranged in the same manner as the XY-alignment mark.

FIG. 13 is similar to FIG. 12 but uses diamond shapes 1341-1348. A single diamond shape is used mimic one bar of the desired appearance. Due to the specific EPI process, the altered appearance of the actual alignment marks will appear as if the original diamond shapes have been rotated. However, this rotation is apparent only, as it is caused by the manner in which EPI material grows on the temporary surface. The apparent rotation of the diamond is useful in that, after the EPI process, the apparently rotated diamond may approximate the shape of one of the bars in the desired appearance.

Figure 14:
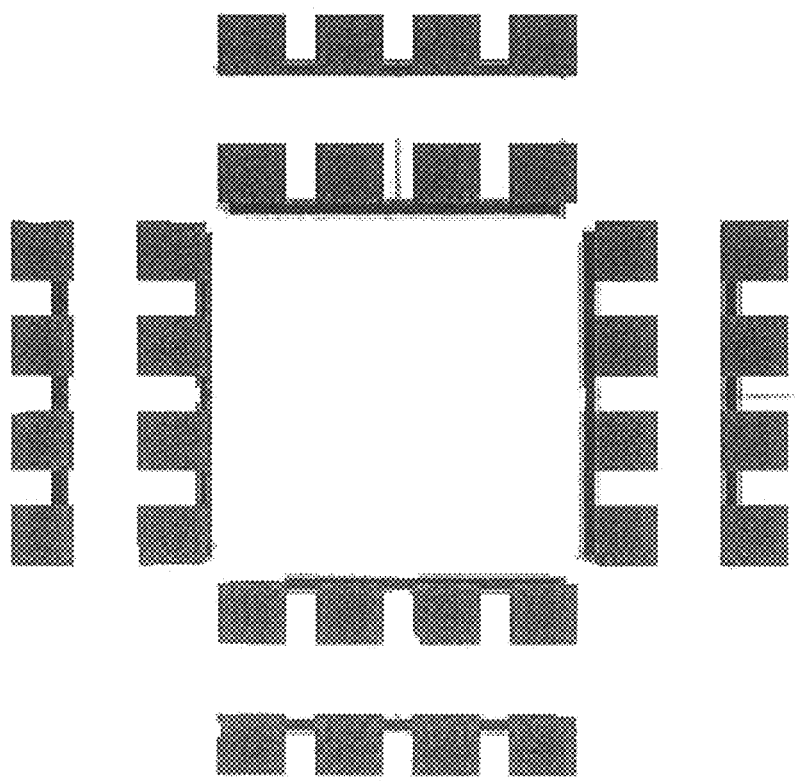
FIG. 14 shows an example using several dots to mimic one bar of the desired appearance of the alignment mark.

FIG. 14 shows a further example in which a plurality of dots or squares in the actual alignment structure are used to mimic one bar of the desired appearance.

Figure 15:
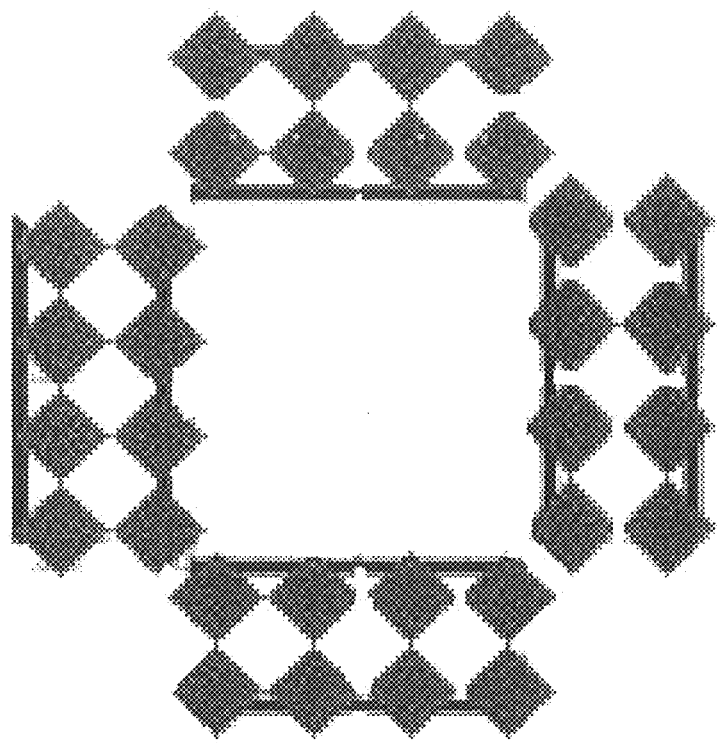
FIG. 15 schematically illustrates an example using several diamond shapes to mimic one bar in the desired appearance of the alignment mark.

FIG. 15 shows a further example in which a plurality of diamond shapes in the actual alignment structure are used to mimic one bar of the desired appearance. Again, a possible apparent rotation of the diamond shapes may be desired and anticipated, resulting in a good approximation of the bars of the desired appearance.

FIG. 16 shows a schematic flow diagram of a method for defining an alignment mark. After the start of the method at 1601 the method comprises a step 1602 of providing a geometrical definition for an actual alignment structure to be formed at a temporary surface of a substrate based on a desired appearance of the alignment mark and on an expected alteration of an appearance of the actual alignment structure. The alteration which is to be expected is caused by a deposition of material, e.g., using an EPI process. The material is deposited on the temporary structure and the actual alignment structure. The method ends at 1603. The method may comprise further additional steps prior and/or subsequent to step 1602.

Figure 17A:
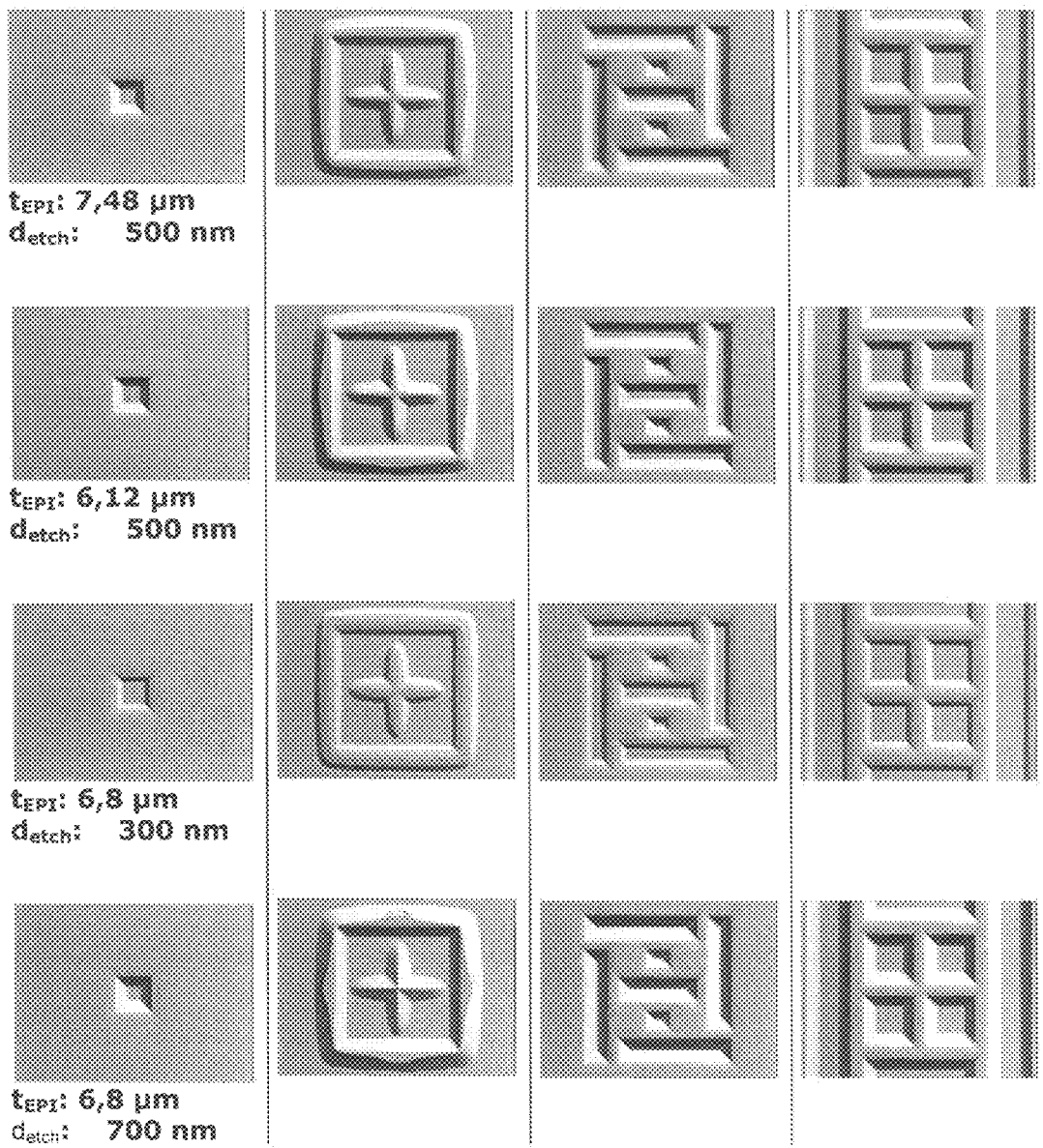
FIGS. 17A and 17B show several examples that illustrate an influence of the EPI process on the structures.
Figure 17B:
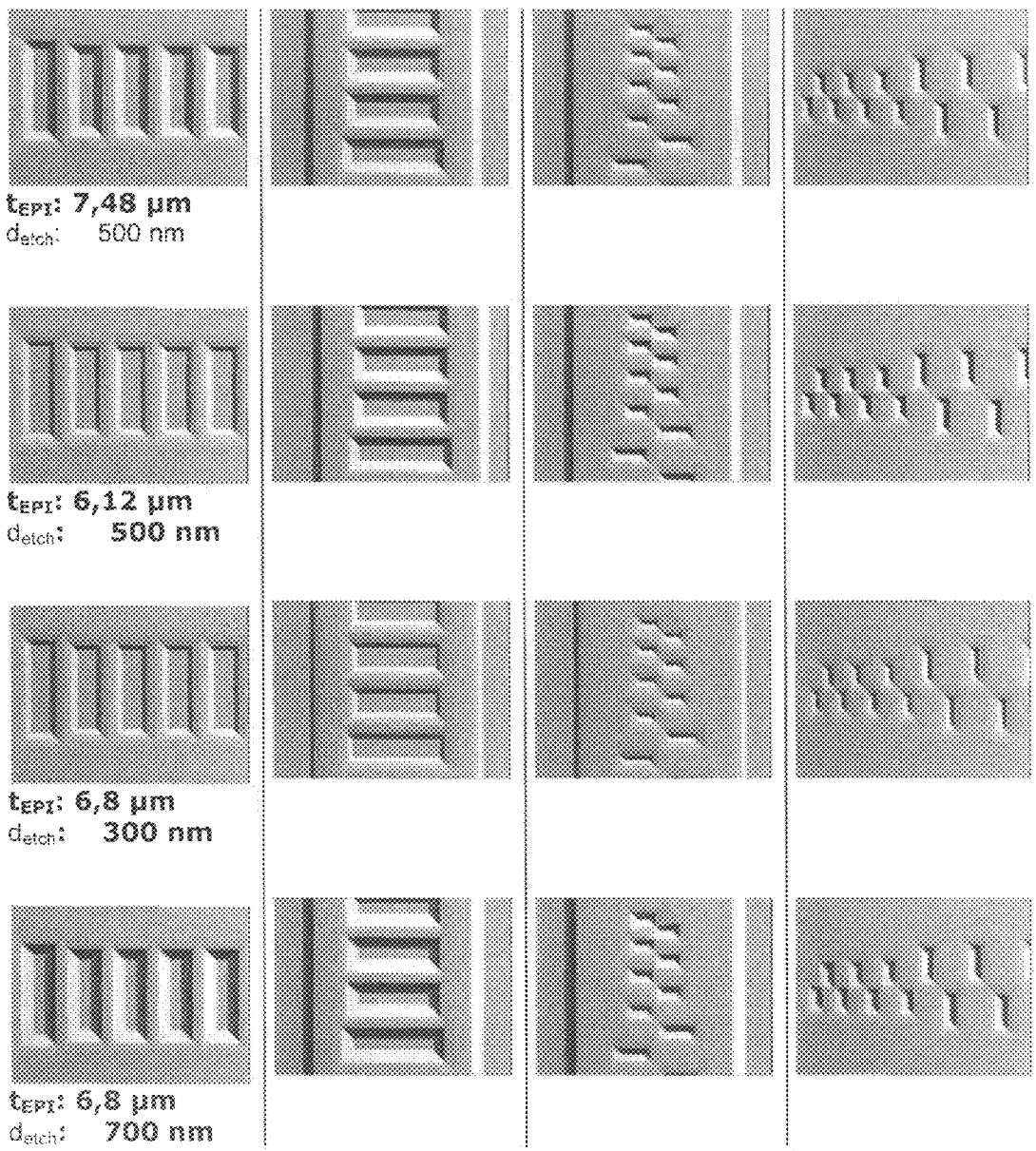

FIGS. 17A and 17B show the results of a study that has been performed on different geometries for actual (alignment) structures for different thicknesses tEPI of the epitactically deposited layer and different etching depth detch. When comparing lines 2, 3 and 4 with each other, it can be seen that a variation of the etching depth of the alignment marks strongly influences the width of the edges. For example, an etching depth of 300 nm (line 3 in FIGS. 17A and 17B) yields relatively narrow edges. An etching depth of 700 nm (line 4) yields relatively wide edges. The EPI process to obtain these results was performed at a temperature of 1,135° C.

Figure 18:
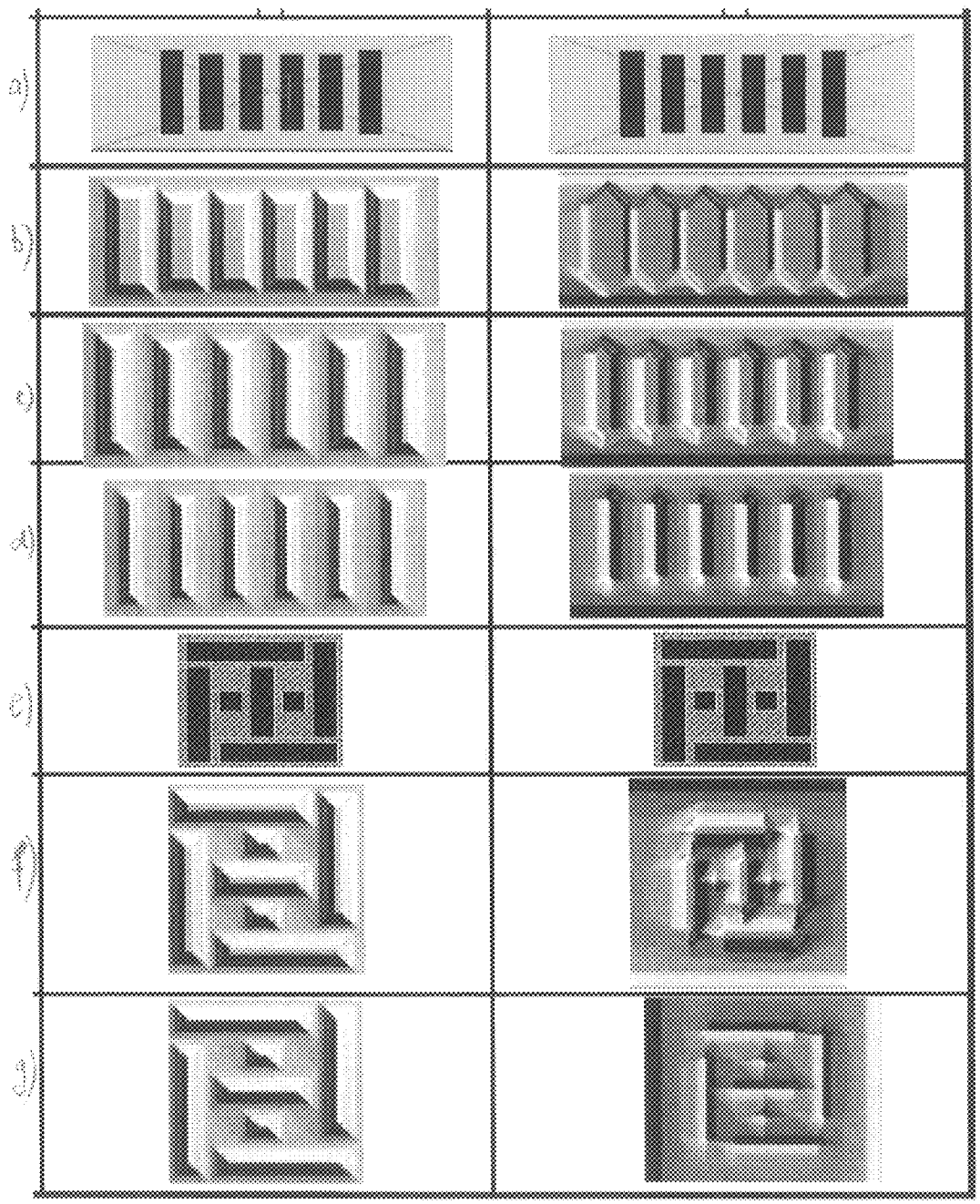
FIG. 18 shows the alterations of the alignment marks as a function of the EPI temperature for two different technologies.

FIG. 18 shows an example for the alteration of the alignment marks as a function of the EPI temperature for two different processes. The left column refers to the so called "PROCESS B" process. The right column refers to the so called "PROCESS A" process. The following table shows some of the process parameters for the two different processes:

TABLE 2

| 8" processes | PROCESS B | PROCESS A |
|---|---|---|
| tilt/rotation | ≤0.15/0° | ≤0.15/45° |
| Etching tool | Mattson (anisotropic) | Mattson (anisotropic) |
| Etching depth | 500 5 nm | 350 nm |
| Deposition gas | (TCS) Trichlorosilan | (TCS) Trichlorosilan |
| Pressure | atmospheric | atmospheric |
| Deposition rate | 3 μm/min | 3 μm/min |
| Standard EPI temperature | 1135 +/− 10° C. | 1150 +/− 10° C. |
| EPI thickness | 10 μm | 8.8 μm |
| Deposition tool | Centura | Centura |
| Exposure Tool | Stepper | Stepper |

Line a) in FIG. 18 shows the DESIGN HeNe 20P12F4I. Line b) shows the altered alignment mark HeNe20P12F4 after an EPI-temperature 1115° C. Line c) shows the altered alignment mark HeNe20P12F4 after an EPI-temperature 1135° C. Line d) shows the altered alignment mark HeNe20P12F4 after an EPI-temperature 1155° C. With increasing temperature, the "PROCESS A" structures deteriorate. In particular, a 45 degree growth behavior can be observed at the inner corners of the windows. The structures of "PROCESS B" shrink and thus get narrower with increasing EPI temperature. These different behaviors of the alignment structures when combined with different process variants (PROCESS A or PROCESS B or further possible process variants) can be taken into account so that the desired appearance is obtained after the selected EPI process has been performed.

Line e) in FIG. 18 shows the DESIGN SPECIAL TVPA ("DESIGN SONDER TVPA"). Line f) shows the special TVPA cross, EPI temperature 1,135° C. Line g) shows the special TVPA cross, EPI temperature 1,155° C.

Figure 19:
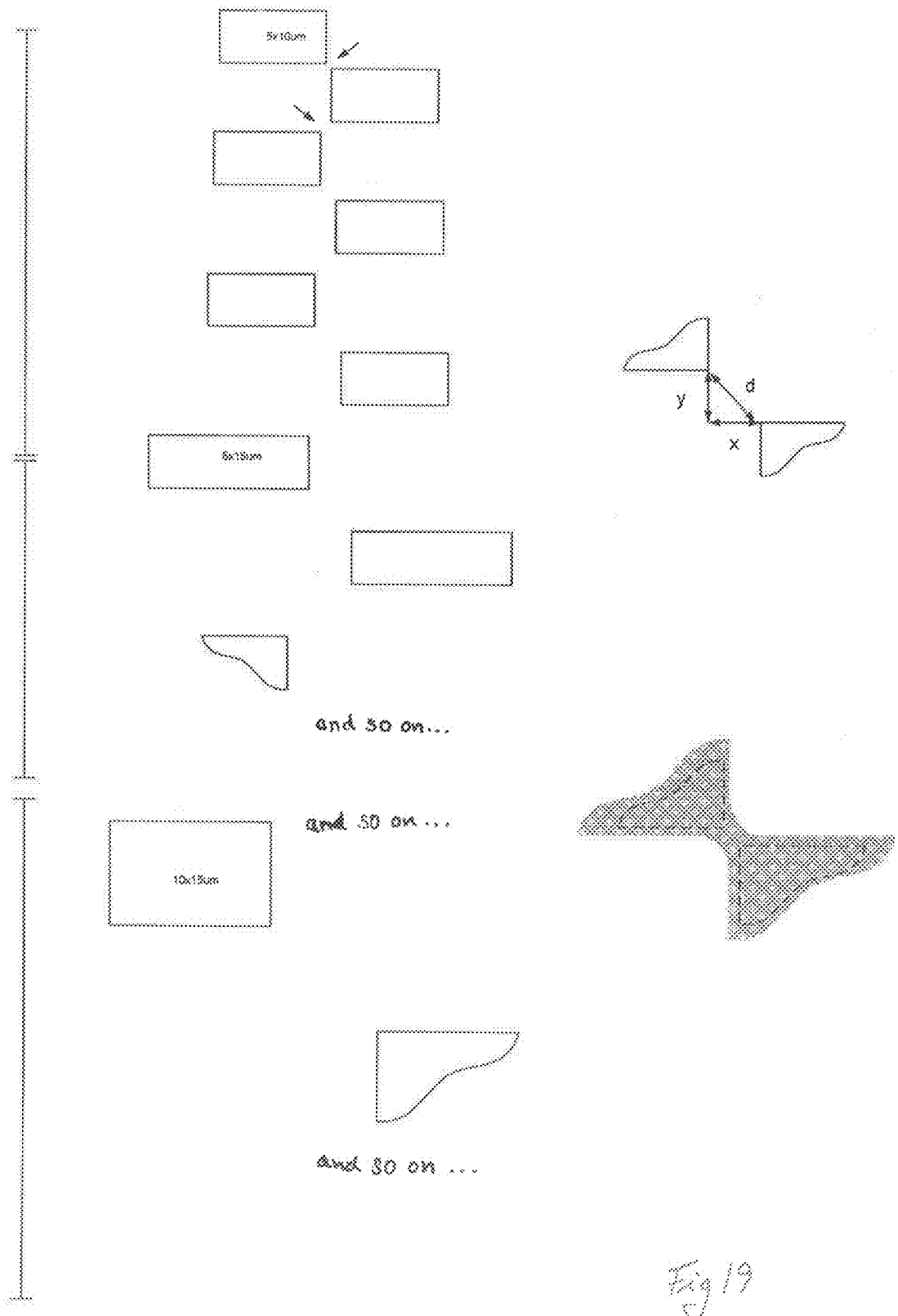
FIG. 19 schematically illustrates an "EPI ruler" that may be used to verify that a desired EPI temperature was maintained during the EPI process.
Figure 20A:
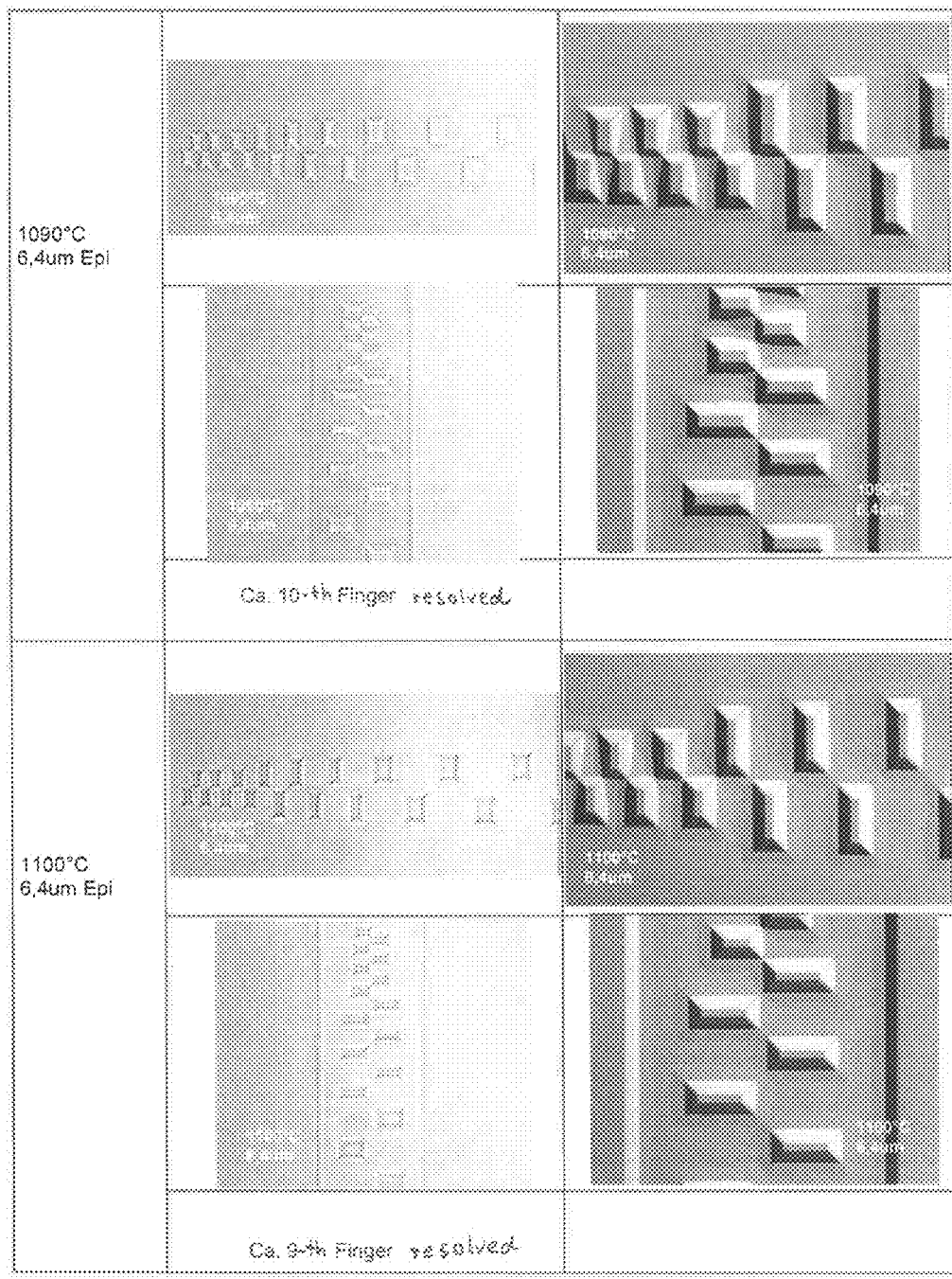
FIGS. 20A to 20H illustrate the different alterations of the structures of an "EPI ruler" similar to the one shown in FIG. 19 for different process temperatures.
Figure 20B:
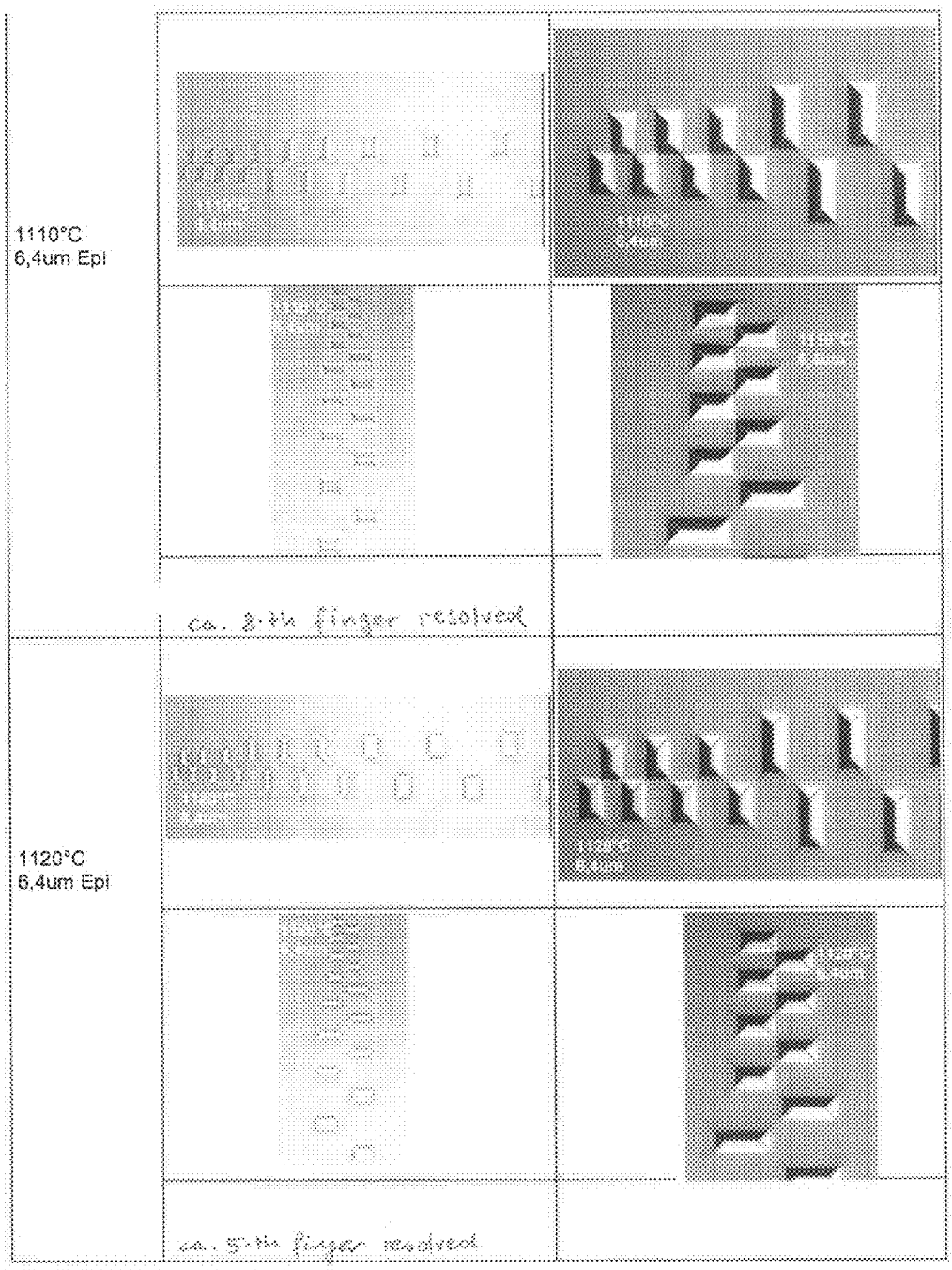
Figure 20C:
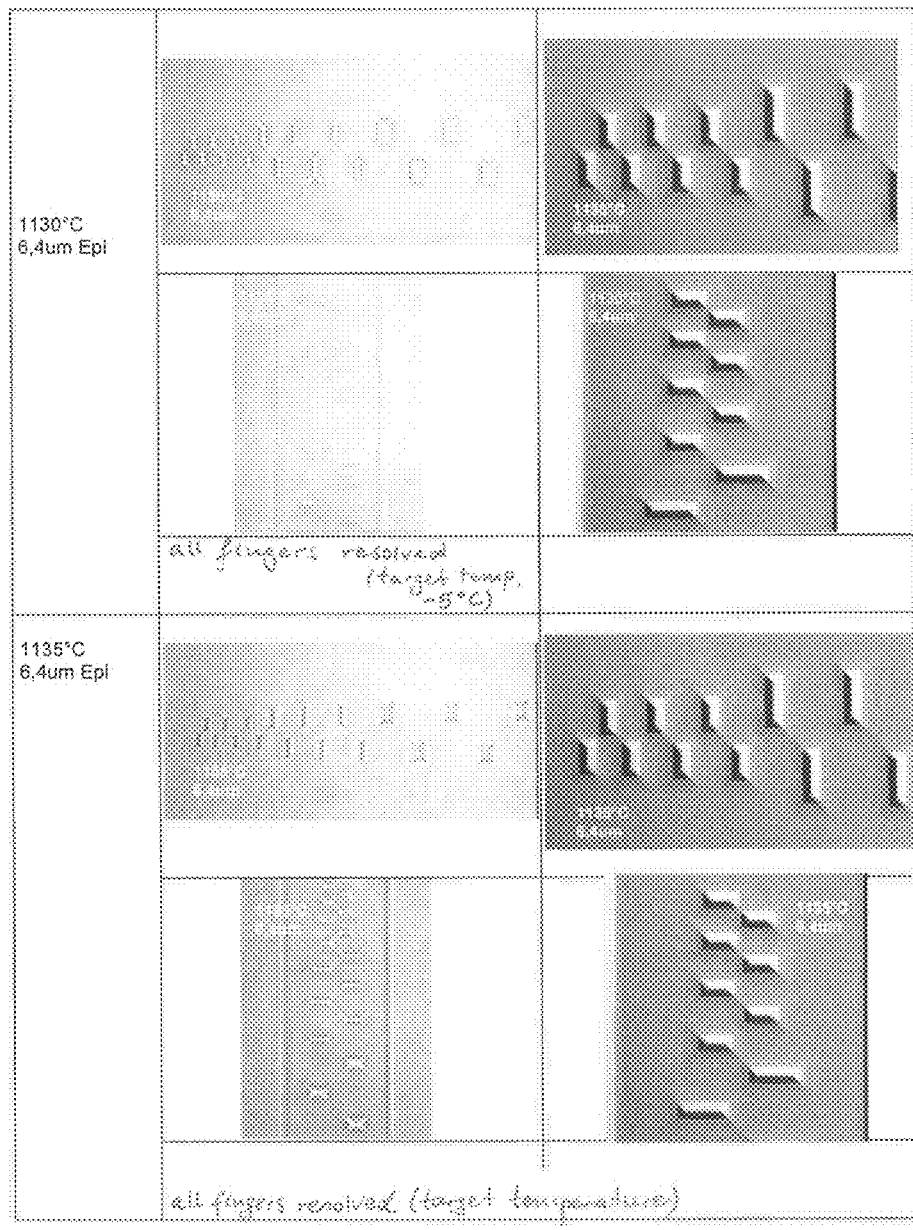
Figure 20D:
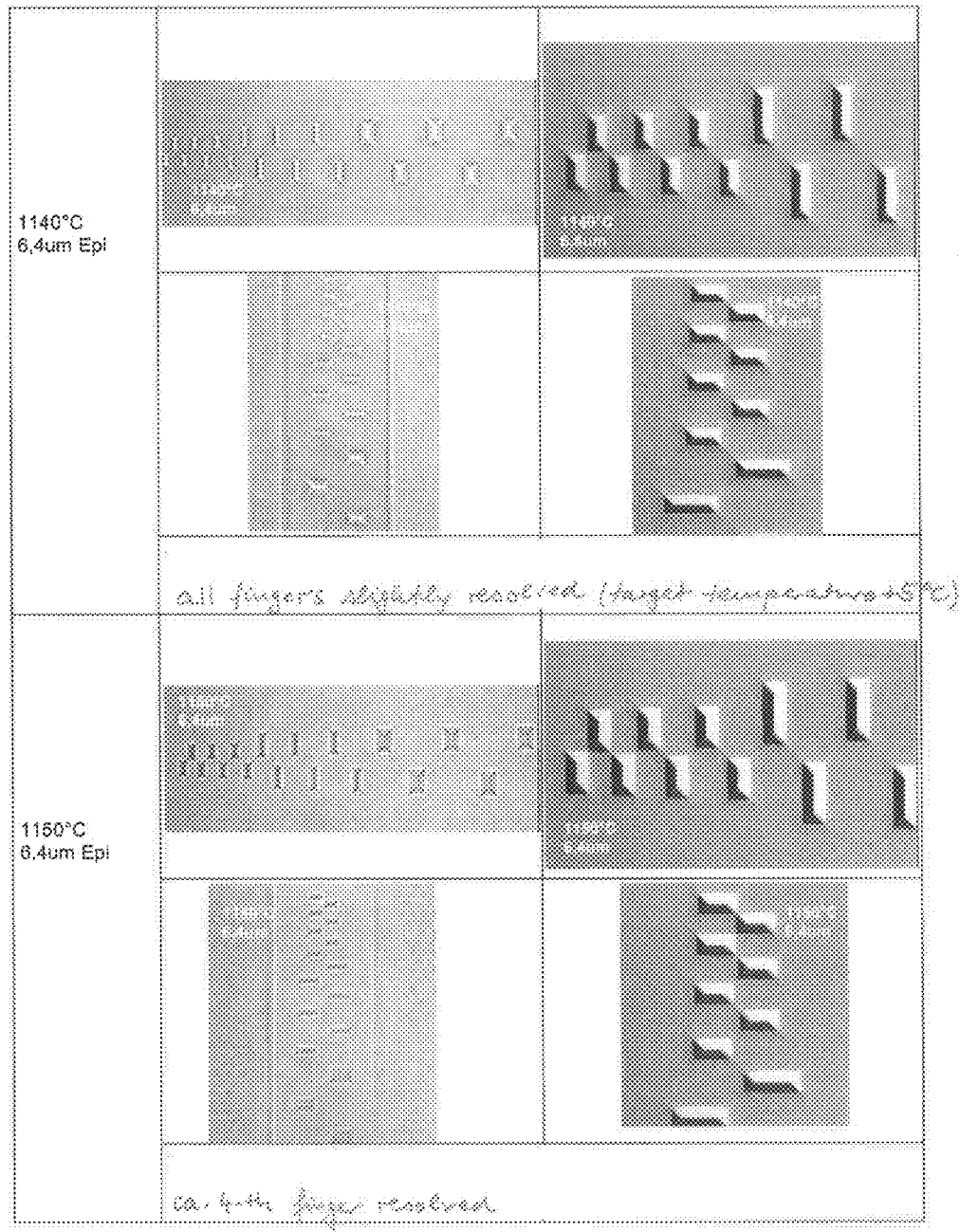
Figure 20E:
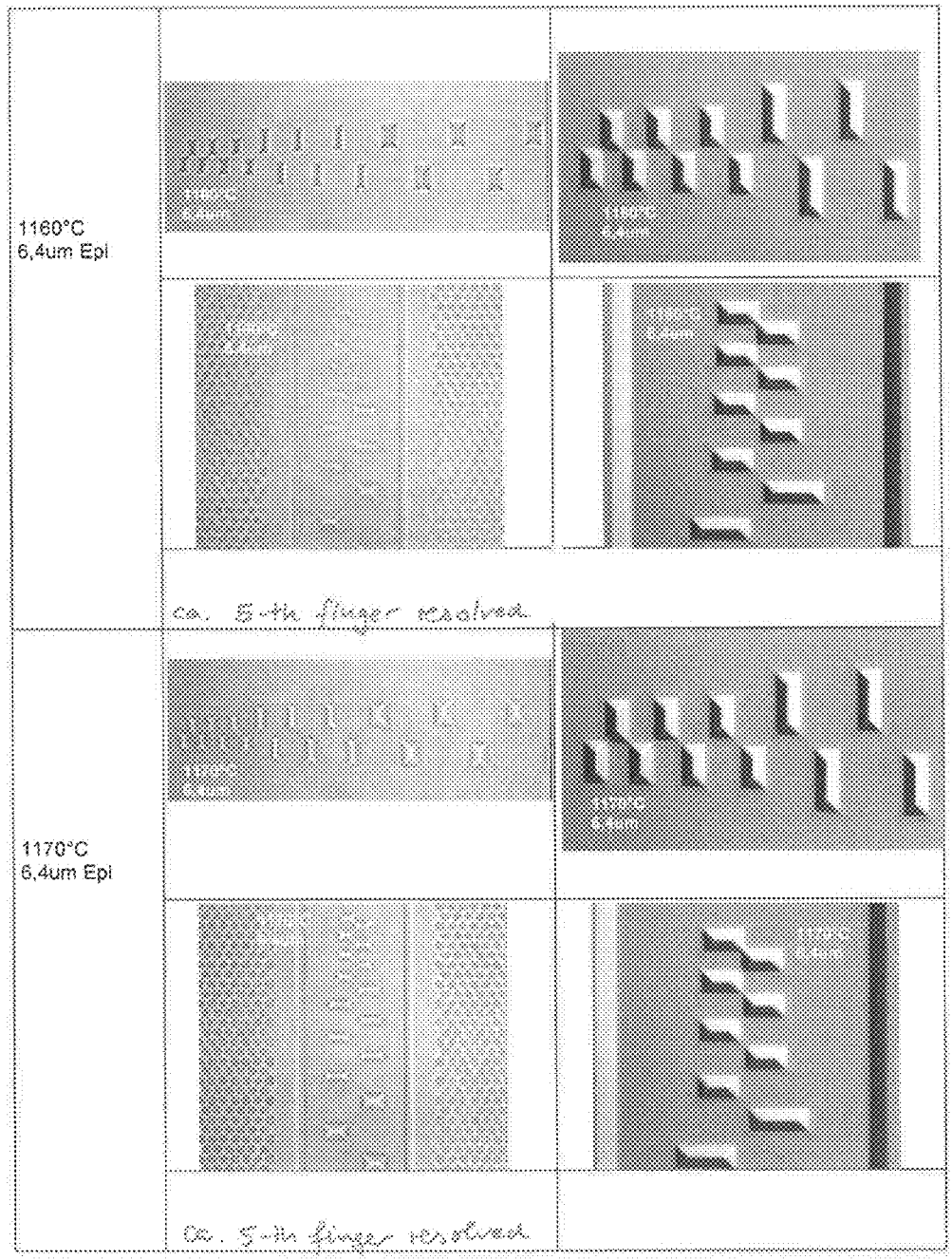
Figure 20F:
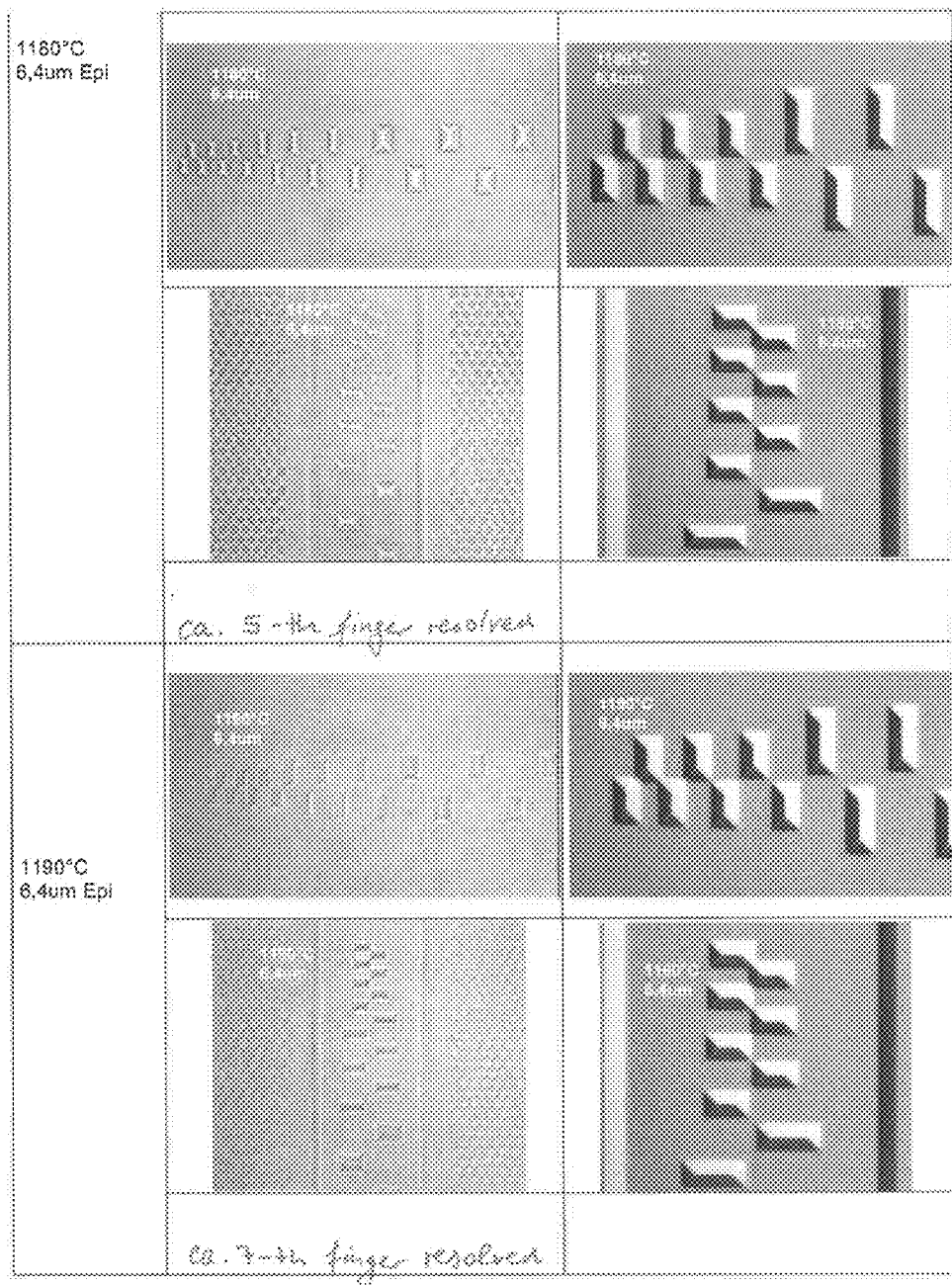
Figure 20G:
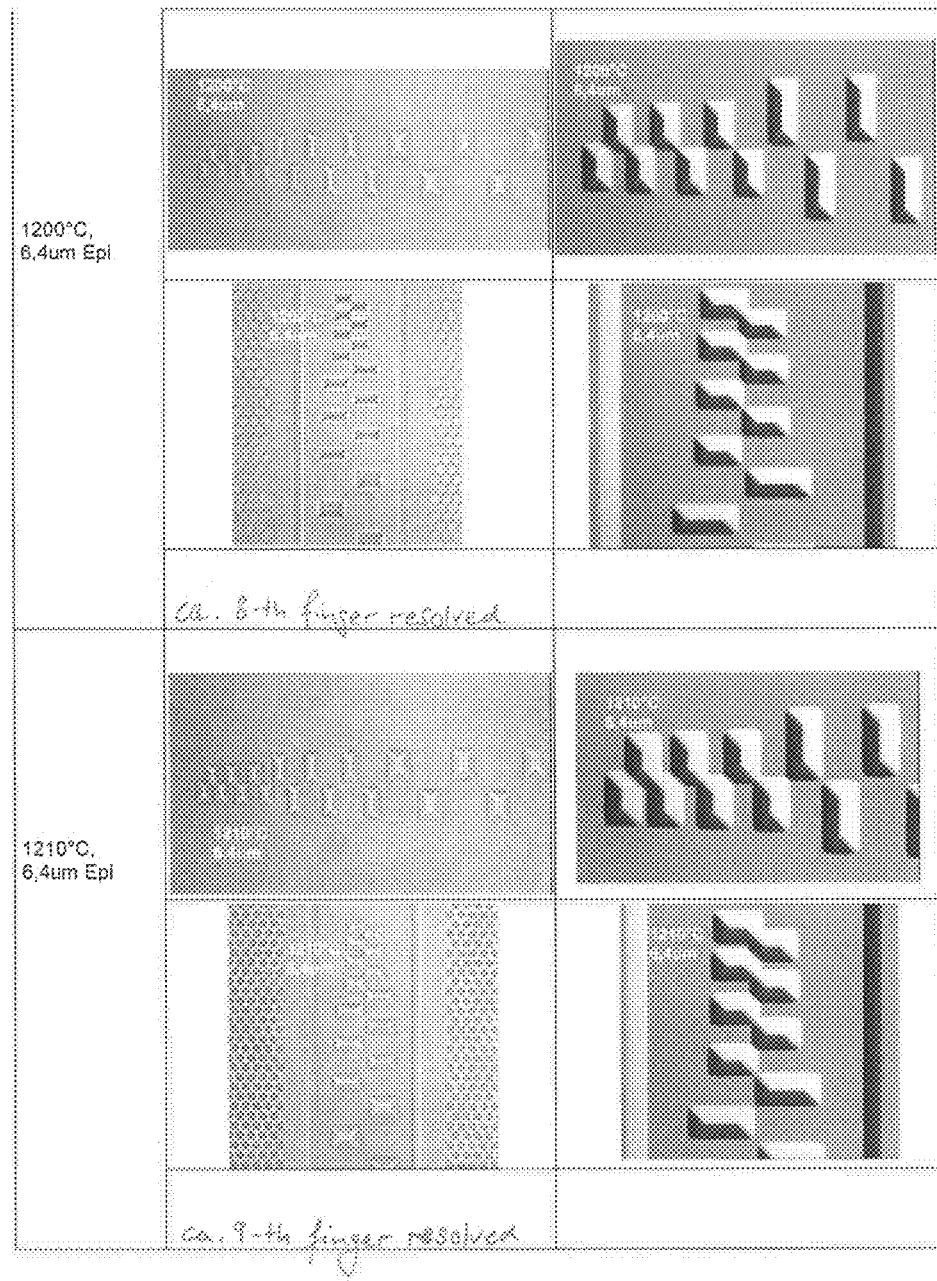
Figure 20H:
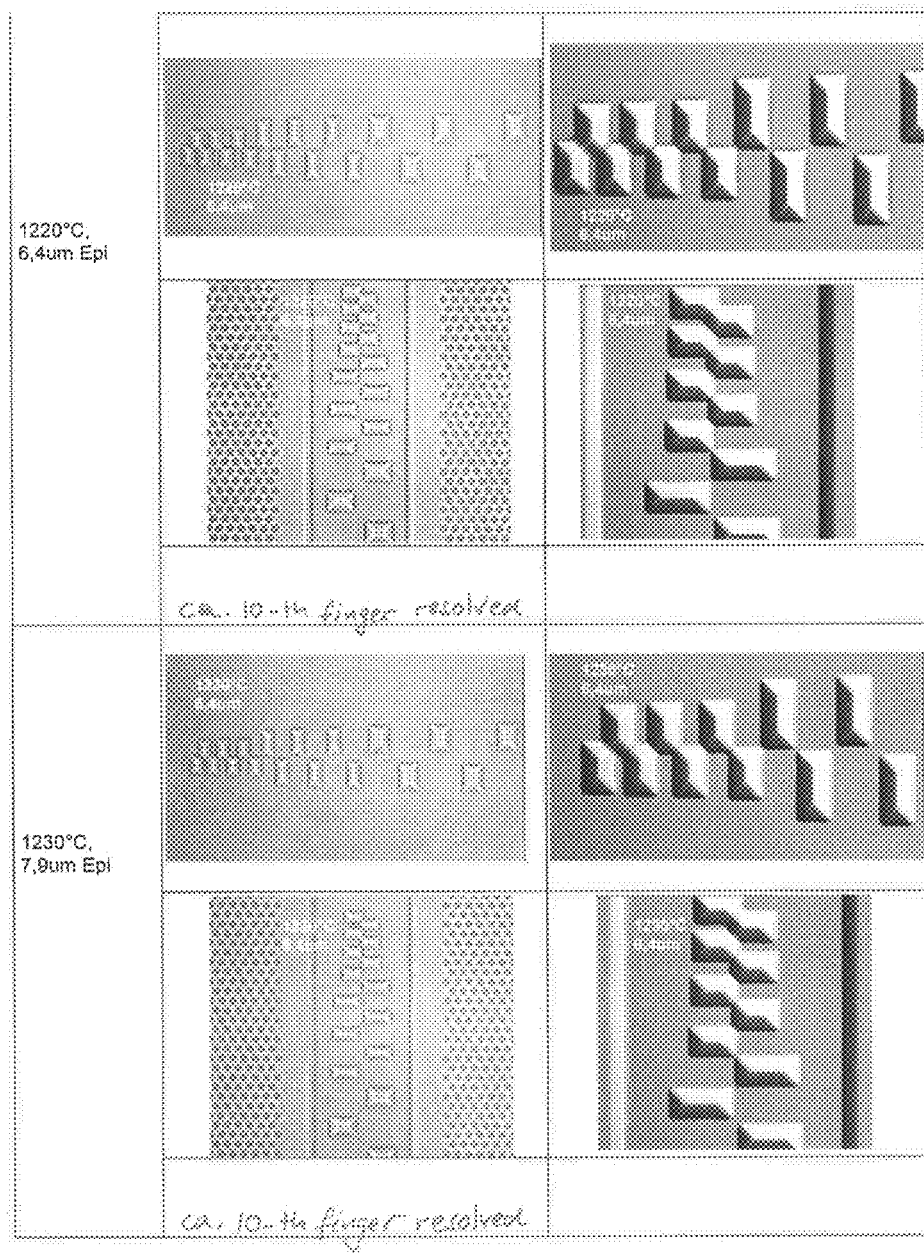

FIG. 19 shows a schematic design description of a structure that may be used as an "EPI ruler." The EPI ruler comprises a plurality of islands that are alternatingly arranged to the left and to the right of an imaginary center line. A first subset of the islands has a relatively small size, for example, 5×10 μm. In a second subset the size is slightly larger, for example, 5×15 μm. In a third subset, the size is even larger, for example, 10×15 μm, and so forth. The gaps between the closes corners of two neighboring islands increases from top to bottom in FIG. 19. The first gap is: x=0.5 μm, y=0.5 μm; i.e., d=0.7 μm, where d is the diagonal distance (see enlarged inset at the right). Within the first subset, the x- and y-distances are increased by steps of 0.5 μm within a range from 0.5 μm to 3.0 μm.

Within the second subset, the x- and y-distances are increased by steps of 1.0 μm within a range from 3.0 μm to 9.0 μm.

Within the third subset, the x- and y-distances are increased again by steps of 1.0 μm within a range from 10.0 μm to 15.0 μm.

The EPI ruler facilitates an analysis of the alteration behavior of structures that are covered by the EPI layer by observing which of the gaps between two islands has/have vanished because the two islands have been altered so much that the corners have merged into each other. As the gaps have increasing widths, there should be a clear separation between a first group of gaps that have not vanished, and a second group of gaps that are not distinguishable anymore.

The principle of the EPI ruler is schematically illustrated in the lower right inset in FIG. 19. The corners are supposed to grow together due to the EPI deposition. As soon as the corners make contact, an inner edge is created at which an increased expitaxial growth can be observed. The ruler can be read out better.

FIGS. 20A to 20H form a temperature scale that can be used to determine at which EPI temperature the EPI process was performed (once reference pictures have been taken at various known temperatures). In FIGS. 20A to 20H the term "resolved finger" means "separated" fingers or fingers that do not touch their neighbor. As the distance of fingers continuously increases along the "EPI ruler," the first couple of fingers will "melt together" (or at least mutually influence each others' growth and shape of corners) until the distance gets large enough to visually see a "gap" between the structures (or do not generate slanted edges of the neighboring finger). Finger number 1 is the first finger, in the photos it is the (small) finger on the far side of the structure, where the gap between fingers (fingers 1 and 2) is narrowest.

The alignment mark definer may be configured to provide a geometrical definition for a plurality of actual geometrical structures having different sizes and different spacings to facilitate an a posteriori assessment of the alteration of the appearance of the actual alignment structure caused by a deposition material deposited on the temporary surface and the actual alignment structure.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like a microprocessor, a programmable computer or an electronic circuit. Some one or more of the most important method steps may be executed by such an apparatus.

The implementation may be in hardware or in software or may be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. A data carrier may be provided which has electronically readable control signals, which are capable of cooperating with a programmable computer system, such that the method described herein is performed.

The implementation may also be in the form of a computer program product with a program code, the program code being operative for performing the method when the computer program product runs on a computer. The program code may be stored on a machine readable carrier.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

What is claimed is:

1. An alignment mark definer configured to provide a geometrical definition for an actual alignment structure to be formed at a temporary surface of a substrate based on a desired appearance of an alignment mark and on an expected alteration of an appearance of the actual alignment structure caused by a deposition material deposited on the temporary surface and the actual alignment structure and to provide the geometrical definition for the actual alignment structure based on a reverse estimation of the expected alteration of the appearance of the actual alignment structure.

2. The alignment mark definer according to claim 1, comprising:
an input for the desired appearance of the alignment mark;
an input for parameters related to a deposition process used for covering the temporary surface and the actual alignment structure with the deposition material; and
an estimator configured to estimate an estimated geometrical definition for the actual alignment structure based on the desired appearance of the alignment mark and the parameters.

3. The alignment mark definer according to claim 2, wherein an actual alignment structure implementing the estimated geometrical definition has an actual appearance, when covered by the deposition material, that mimics the desired appearance.

4. The alignment mark definer according to claim 1, wherein the geometrical definition for the actual alignment structure mimics the desired appearance by providing one of a sidewall and an edge of a sidewall in a region, where the desired appearance defines one of a window and an island.

5. The alignment mark definer according to claim 1, wherein the geometrical definition provides one broad window for each pair of parallel windows, for each pair of parallel islands, or for each pair of a window and a parallel island.

6. The alignment mark definer according to claim 1, wherein the geometrical definition provides one broad island for each pair of parallel windows, for each pair of parallel islands, or for each pair of a window and a parallel island.

7. The alignment mark definer according to claim 1, wherein an arrangement of several windows or islands in the desired appearance is mimicked by the geometrical definition by one of a broad window and a broad island, wherein sidewalls of one of the broad window and the broad islands are disposed in accordance with the arrangement of the windows or islands of the desired appearance.

8. The alignment mark definer according to claim 1, wherein the desired appearance of the alignment mark comprises an arrangement of several pairs of windows or islands, wherein the windows or islands of each pair are parallel to each other,
wherein the geometrical definition mimics the arrangement by one of a broad window and a broad island, and wherein edges of sidewalls of one of the broad window and the broad island are disposed in accordance with the arrangement of the windows or islands of the desired appearance.

9. The alignment mark definer according to claim 1, wherein the geometrical definition for the actual alignment structure is describable as an absolute value of a spatial low pass filtering of the desired appearance.

10. The alignment mark definer according to claim 1, further configured to take into account, when providing the geometrical definition for the actual alignment structure, a rotation between actual geometrical structures and corresponding desired geometric structures by a certain angle caused by a deposition of the deposition material.

11. The alignment mark definer according to claim 1, further configured to provide the geometrical definition for the actual alignment structure in the form of a segmented substructure to mimic a desired structure of the desired appearance.

12. The alignment mark definer according to claim 1, further configured to take into account a different alteration behavior of an inner corner and an outer corner when covered by the deposition material.

13. The alignment mark definer according to claim 1, further configured to provide a further geometrical definition for a plurality of actual geometrical structures having different sizes and different spacings to facilitate an a posteriori assessment of the alteration of the appearance of the actual alignment structure caused by a deposition material deposited on the temporary surface and the actual alignment structure.

14. A method for defining an alignment mark, the method comprising:
providing a geometrical definition for an actual alignment structure to be formed at a temporary surface of a substrate based on a desired appearance of the alignment mark and on an expected alteration of an appearance of the actual alignment structure caused by a deposition material deposited on the temporary surface and the actual alignment structure; and
providing the geometrical definition for the actual alignment structure based on a reverse estimation of the expected alteration of the appearance of the actual alignment structure.

15. The method according to claim 14, further comprising:
receiving a definition for the desired appearance of the alignment mark;
receiving at least one parameter related to a deposition process used for depositing the deposition material on the temporary surface and on the actual alignment structure; and
estimating an estimated geometrical definition for the actual alignment structure based on the desired appearance of the alignment mark and on the parameters.

16. The method according to claim 14, wherein an actual alignment structure implementing the estimated geometrical definition has an actual appearance, when covered by the deposition material, that mimics the desired appearance.

17. The method according to claim 14, wherein the geometrical definition for the actual alignment structure mimics the desired appearance by providing one of a sidewall and an edge of a sidewall in a region, where the desired appearance defines one of a window and an island.

18. The method according to claim 14, wherein the geometrical definition for the actual alignment structure is describable as an absolute value of a spatial low pass filtering of the desired appearance.

19. A non-transitory storage medium having stored thereon a computer program having a program code for performing, when running on a computer or microprocessor, a method for defining an alignment mark, the method comprising:
provinding a geometrical definition for an actual alignment structure to be formed at a temporary surface of a substrate based on a desired appearance of the alignment mark and on an expected alteration of an appearance of the actual alignment structure caused by a deposition material deposited on the temporary surface and the actual alignment structure; and
providing the geometrical definition for the actual alignment structure based on a reverse estimation of the expected alteration of the appearance of the actual alignment structure.

20. An alignment mark definer configured to provide a geometrical definition for an actual alignment structure to be formed at a temporary surface of a substrate based on a desired appearance of an alignment mark and on an expected alteration of an appearance of the actual alignment structure caused by a deposition material deposited on the temporary surface and the actual alignment structure,
wherein the alignment mark definer comprises:
an input for the desired appearance of the alignment mark;
an input for parameters related to a deposition process used for covering the temporary surface and the actual alignment structure with the deposition material; and
an estimator configured to estimate an estimated geometrical definition for the actual alignment structure based on the desired appearance of the alignment mark and the parameters.

21. The alignment mark definer according to claim 20, wherein an actual alignment structure implementing the estimated geometrical definition has an actual appearance, when covered by the deposition material, that mimics the desired appearance.

22. An alignment mark definer configured to provide a geometrical definition for an actual alignment structure to be formed at a temporary surface of a substrate based on a desired appearance of an alignment mark and on an expected alteration of an appearance of the actual alignment structure caused by a deposition material deposited on the temporary surface and the actual alignment structure, wherein the geometrical definition for the actual alignment structure is describable as an absolute value of a spatial low pass filtering of the desired appearance.

23. An alignment mark definer configured to provide a geometrical definition for an actual alignment structure to be formed at a temporary surface of a substrate based on a desired appearance of an alignment mark and on an expected alteration of an appearance of the actual alignment structure caused by a deposition material deposited on the temporary surface and the actual alignment structure, and to take into account a different alteration behavior of an inner corner and an outer corner when covered by the deposition material.

* * * * *